United States Patent
Nakamura

[11] Patent Number: 5,819,073
[45] Date of Patent: Oct. 6, 1998

[54] SIMULATION METHOD AND SIMULATOR

[75] Inventor: Mitsutoshi Nakamura, Kanagawa, Japan

[73] Assignee: Kabushiki Kaisha Toshiba, Kawasaki, Japan

[21] Appl. No.: 709,535

[22] Filed: Sep. 6, 1996

[30] Foreign Application Priority Data

Sep. 12, 1995 [JP] Japan ................................. 7-234230

[51] Int. Cl.$^6$ .................................................. G06F 17/16
[52] U.S. Cl. ........................ 375/500; 364/496; 364/498; 364/578; 364/573
[58] Field of Search .................................. 395/500, 561; 364/578, 496, 497, 498, 852, 573

[56] References Cited

U.S. PATENT DOCUMENTS

| | | | |
|---|---|---|---|
| 4,972,334 | 11/1990 | Yamabe et al. | 364/200 |
| 5,129,035 | 7/1992 | Saji et al. | 395/1 |
| 5,265,040 | 11/1993 | Saji et al. | 364/578 |
| 5,408,638 | 4/1995 | Sagawa et al. | 395/500 |
| 5,438,526 | 8/1995 | Itoh et al. | 364/578 |
| 5,590,051 | 12/1996 | Yokozawa | 364/496 |
| 5,625,579 | 4/1997 | Hinsberg, III et al. | 364/578 |
| 5,640,331 | 6/1997 | Dahm et al. | 364/496 |

OTHER PUBLICATIONS

Simulation of Boron Diffusion in High Concentration using a Part Diffusion Model, Nakamura et al, Sep. 1995, p. 7.

Primary Examiner—Kevin J. Teska
Assistant Examiner—Thai Phan
Attorney, Agent, or Firm—Foley & Lardner

[57] ABSTRACT

A simulation method and a simulator determine a profile of particles, by determining whether or not each reaction formula, which describes a reaction of particles to generate reactants in semiconductor solids or gases, is in equilibrium, determining unknown variables excluding variables related to the reactants of each equilibrium reaction, forming continuity equations containing a plurality of time differential terms as functions of the unknown variables, linearizing and discretizing the time differential terms into the coefficient matrix and constant vector of simultaneous linear equations, and solving the simultaneous linear equations.

19 Claims, 25 Drawing Sheets

FIG.4
PRIOR ART

| $\Delta t$ (min) \ $C_I/C_A$ | $10^{-1}$ | $10^{-3}$ | $10^{-5}$ | $10^{-7}$ | $10^{-8}$ | $10^{-10}$ |
|---|---|---|---|---|---|---|
| 100.00 | DIVERGE | DIVERGE | 11 | 5 | 4 | 4 |
| 10.00 | DIVERGE | DIVERGE | 11 | 5 | 4 | 4 |
| 1.00 | DIVERGE | DIVERGE | DIVERGE | OSCILLATE | OSCILLATE | 221 |
| 0.10 | DIVERGE | DIVERGE | DIVERGE | DIVERGE | 57 | 7 |
| 0.01 | DIVERGE | DIVERGE | DIVERGE | DIVERGE | 50 | 6 |

| MEDIUM | REACTION NUMBER | DATA | |
|---|---|---|---|
| Si | 1 | NAME OF FIRST PARTICLES | A |
| | | NUMBER OF FIRST PARTICLES | 1 |
| | | NAME OF SECOND PARTICLES | I |
| | | NUMBER OF SECOND PARTICLES | 1 |
| | | NAME OF REACTION PARTICLES | AI |
| | | NUMBER OF REACTION PARTICLES | 1 |
| | | FORWARD REACTION RATE COEFFICIENT | $k_f^{AI}$ |
| | | BACKWARD REACTION RATE COEFFICIENT | $k_b^{AI}$ |
| | | EQUILIBRIUM CONSTANT | $k_f^{AI}/k_b^{AI}$ |
| | | REACTION STATE | 1 |
| | 2 | NAME OF FIRST PARTICLES | A |
| | | NUMBER OF FIRST PARTICLES | 1 |
| | | NAME OF SECOND PARTICLES | V |
| | | NUMBER OF SECOND PARTICLES | 1 |
| | | NAME OF REACTION PARTICLES | AV |
| | | NUMBER OF REACTION PARTICLES | 1 |
| | | FORWARD REACTION RATE COEFFICIENT | $k_f^{AV}$ |
| | | BACKWARD REACTION RATE COEFFICIENT | $k_b^{AV}$ |
| | | EQUILIBRIUM CONSTANT | $k_f^{AV}/k_b^{AV}$ |
| | | REACTION STATE | 1 |

| MEDIUM | REACTION NUMBER | DATA | |
|---|---|---|---|
| Si | 3 | NAME OF FIRST PARTICLES | I |
| | | NUMBER OF FIRST PARTICLES | 1 |
| | | NAME OF SECOND PARTICLES | V |
| | | NUMBER OF SECOND PARTICLES | 1 |
| | | NAME OF REACTION PARTICLES | 0 |
| | | NUMBER OF REACTION PARTICLES | 1 |
| | | FORWARD REACTION RATE COEFFICIENT | $k_f^{IV}$ |
| | | BACKWARD REACTION RATE COEFFICIENT | $k_b^{IV}$ |
| | | EQUILIBRIUM CONSTANT | $k_f^{IV}/k_b^{IV}$ |
| | | REACTION STATE | 0 |
| | 4 | NAME OF FIRST PARTICLES | I |
| | | NUMBER OF FIRST PARTICLES | 1 |
| | | NAME OF SECOND PARTICLES | T |
| | | NUMBER OF SECOND PARTICLES | 1 |
| | | NAME OF REACTION PARTICLES | IT |
| | | NUMBER OF REACTION PARTICLES | 1 |
| | | FORWARD REACTION RATE COEFFICIENT | $k_f^{IT}$ |
| | | BACKWARD REACTION RATE COEFFICIENT | $k_b^{IT}$ |
| | | EQUILIBRIUM CONSTANT | $k_f^{IT}/k_b^{IT}$ |
| | | REACTION STATE | 0 |

| MEDIUM | REACTION NUMBER | DATA | |
|---|---|---|---|
| | 5 | NAME OF FIRST PARTICLES | A |
| | | NUMBER OF FIRST PARTICLES | m |
| | | NAME OF SECOND PARTICLES | - |
| | | NUMBER OF SECOND PARTICLES | 0 |
| | | NAME OF REACTION PARTICLES | $A_{Cv}$ |
| | | NUMBER OF REACTION PARTICLES | 1 |
| | | FORWARD REACTION RATE COEFFICIENT | $k_f^{Cv}$ |
| | | BACKWARD REACTION RATE COEFFICIENT | $k_b^{Cv}$ |
| | | EQUILIBRIUM CONSTANT | $k_f^{Cv}/k_b^{Cv}$ |
| | | REACTION STATE | 1 |

| NAME OF PARTICLES | MEDIUM | DATA | |
|---|---|---|---|
| A | Si | DIFFUSION COEFFICIENT | $D_A$ |
| | | EQUILIBRIUM CONCENTRATION | - |
| | | CONSTANT CONCENTRATION CONDITION | - |
| I | Si | DIFFUSION COEFFICIENT | $D_I$ |
| | | EQUILIBRIUM CONCENTRATION | $N_I^*$ |
| | | CONSTANT CONCENTRATION CONDITION | - |
| V | Si | DIFFUSION COEFFICIENT | $D_V$ |
| | | EQUILIBRIUM CONCENTRATION | $N_I^*$ |
| | | CONSTANT CONCENTRATION CONDITION | - |
| T | Si | DIFFUSION COEFFICIENT | 0 |
| | | EQUILIBRIUM CONCENTRATION | $N_T^*$ |
| | | CONSTANT CONCENTRATION CONDITION | - |
| AI | Si | DIFFUSION COEFFICIENT | $D_{AI}$ |
| | | EQUILIBRIUM CONCENTRATION | - |
| | | CONSTANT CONCENTRATION CONDITION | - |
| AV | Si | DIFFUSION COEFFICIENT | $D_{AV}$ |
| | | EQUILIBRIUM CONCENTRATION | - |
| | | CONSTANT CONCENTRATION CONDITION | - |
| IT | Si | DIFFUSION COEFFICIENT | 0 |
| | | EQUILIBRIUM CONCENTRATION | - |
| | | CONSTANT CONCENTRATION CONDITION | 1 |
| $A_{Cl}$ | Si | DIFFUSION COEFFICIENT | 0 |
| | | EQUILIBRIUM CONCENTRATION | - |
| | | CONSTANT CONCENTRATION CONDITION | - |

FIG.13

$$F_A = \frac{\partial N_A}{\partial t} = +\frac{\partial K_{AI} \cdot N_A \cdot N_I}{\partial t} + \frac{\partial K_{AV} \cdot N_A \cdot N_V}{\partial t} + \nabla J_{AI} + \nabla J_{AV}$$

$$F_I = \frac{\partial N_I}{\partial t} = +\frac{\partial K_{AI} \cdot N_A \cdot N_I}{\partial t} + \nabla J_I + \nabla J_{AI} + R_{IV} - R_{IT}$$

$$F_V = \frac{\partial N_V}{\partial t} = +\frac{\partial K_{AV} \cdot N_A \cdot N_V}{\partial t} + \nabla J_V + \nabla J_{AV} + R_{IV}$$

$$F_T = \frac{\partial N_T}{\partial t} = -R_{IT}$$

1901, 1902, 1903, 1904, 1905

| $C_I / C_A$ \ $\triangle t$ (min) | $10^1$ | $10^{-1}$ | $10^{-3}$ | $10^{-5}$ | $10^{-7}$ | $10^{-9}$ |
|---|---|---|---|---|---|---|
| 100.00 | 27 | 17 | 17 | 10 | 4 | 4 |
| 10.00 | 26 | 17 | 16 | 9 | 6 | 4 |
| 1.00 | 29 | 20 | 10 | 7 | 6 | 5 |
| 0.10 | 16 | 13 | 11 | 7 | 5 | 3 |
| 0.01 | 15 | 12 | 10 | 5 | 4 | 3 |

FIG. 16

REACTION TABLE

| MEDIUM | REACTION NUMBER | DATA |
|---|---|---|
| Si | | NAME OF FIRST PARTICLES : nm $\ell_1$ |
| | | NUMBER OF FIRST PARTICLES : m $\ell_1$ |
| | | NAME OF SECOND PARTICLES : nm $\ell_2$ |
| | | NUMBER OF SECOND PARTICLES : m $\ell_2$ |
| | | NAME OF REACTION PARTICLES : nm $r$ |
| | | NUMBER OF REACTION PARTICLES : m $r$ |
| | | FORWARD REACTION RATE COEFFICIENT : $k_f$ |
| | | BACKWARD REACTION RATE COEFFICIENT : $k_b$ |
| | | EQUILIBRIUM CONSTANT : K |
| | | REACTION STATE : ST (0:NON-EQUILIBRIUM, 1:EQUILIBRIUM) |
| | | NAME OF FIRST PARTICLES : nm $\ell_1$ |
| | | NUMBER OF FIRST PARTICLES : m $\ell_1$ |
| | | NAME OF SECOND PARTICLES : nm $\ell_2$ |
| | | NUMBER OF SECOND PARTICLES : m $\ell_2$ |
| | | NAME OF REACTION PARTICLES : nm $r$ |
| | | NUMBER OF REACTION PARTICLES : m $r$ |
| | | FORWARD REACTION RATE COEFFICIENT : $k_f$ |
| | | BACKWARD REACTION RATE COEFFICIENT : $k_b$ |
| | | EQUILIBRIUM CONSTANT : K |
| | | REACTION STATE : ST (0:NON-EQUILIBRIUM, 1:EQUILIBRIUM) |

FIG.17

PARTICLE TABLE

| NAME OF PARTICLES | MEDIUM | DATA |
|---|---|---|
| | | DIFFUSION COEFFICIENT : D |
| | | EQUILIBRIUM CONCENTRATION : $N^*$ |
| | | CONSTANT CONCENTRATION CONDITION |
| | | |
| | | DIFFUSION COEFFICIENT : D |
| | | EQUILIBRIUM CONCENTRATION : $N^*$ |
| | | CONSTANT CONCENTRATION CONDITION |
| | | |

SIMULATION METHOD AND SIMULATOR

BACKGROUND OF THE INVENTION

1. Field of the Invention

The present invention relates to a method of and an apparatus for simulating the profiles of impurities and crystalline defects in solids such as semiconductor materials, or the profiles of particles contained in gases used in semiconductor device manufacturing equipment such as a chemical vapor deposition (CVD) furnace. In particular, the present invention relates to a method of and an apparatus for numerically solving a set of continuity equations (or equations of continuity) of fluid (or particles contained in solids) and simulating the structure of semiconductor devices such as ULSIs and VLSIs and the manufacturing process of the semiconductor devices.

2. Description of the Prior Art

Recent computers are capable of executing a great number of calculations at high speed and are practically used as simulators to numerically solve continuity equations that express mass conservation in the reaction and transportation of particles contained in solids or fluid. The simulators evaluate the structures and manufacturing processes of semiconductor devices during a designing stage, to shorten a designing period and improve the characteristics and reliability of semiconductor products.

To evaluate the structure and characteristics of each semiconductor device, it is necessary to examine the device geometry, impurity profile, and electric characteristics of the device. Conventionally, such evaluation work is carried out by fabricating trial samples, measuring them, comparing the measurements with design values, and repeating these processes until required results are obtained.

This method needs a long time and a lot of manpower, and therefore, is inefficient. In addition, this method is unable to evaluate recent fine semiconductor devices of submicron, subquartermicron, mesoscopic, or atomic scale.

In these situations, a technology CAD (TCAD) becomes more important. When designing semiconductor devices, the TCAD numerically solves basic equations such as continuity equations and Poisson's equations expressing mass conservation in the reaction and transportation of particles, and provides the impurity profiles, device geometry, electric characteristics, and circuit arrangements of the devices. The TCAD consists of user interfaces and simulators. Among the simulators, a process simulator simulates various manufacturing processes of semiconductor devices, to find out the impurity profile and geometry of each device. The process simulator involves single-process simulators for simulating ion implantation, oxidation, diffusion, etching, etc., respectively. These simulators are basically the same because they solve mathematically equivalent equations such as continuity equations.

FIG. 1 is a block diagram showing a conventional simulator for solving time-evolution continuity equations. A mesh generator 101 generates meshes used to form discrete expressions that approximate continuity equations. A concentration profile setter 102 sets concentrations on the meshes, to solve the continuity equations. An initial condition setter 103 uses a physical parameter database 107, to set the initial conditions of the continuity equations and the scaling of variables. A solver 104 has a time slicer, a simultaneous-linear-equations solver, and a solution updating unit, to solve simultaneous nonlinear partial differential equations until termination conditions are met. A post-processor 105 carries out post-processes such as the resealing of variables. A setter 106 sets the coefficient matrix and constant vector of simultaneous linear equations that are obtained by linearizing, and discretizing the continuity equations.

The linearizing operation rewrites nonlinear equations into linear equations that are used to approximate a true solution by iteratively adding correction values to an initial value $X_o$. A generally used linearization technique is a Newton method that linearizes a nonlinear equation into linear terms according to Taylor expansion. For example, a nonlinear equation $f(x)=0$ is linearized as follows:

$$f(x)+f'(x)\cdot \Delta x=0 \qquad (1)$$

where $f'(x)$ is a first order differential of $f(x)$, x is a known value, and $\Delta x$ is a new unknown value. The equation (1) and the following equation (2) are iterated to find a true solution:

$$x = x + \Delta x \qquad (2)$$

Simultaneous nonlinear equations f and g that are functions of x, and y are linearized as follows:

$$\begin{pmatrix} \frac{\partial f}{\partial x} & \frac{\partial f}{\partial y} \\ \frac{\partial g}{\partial x} & \frac{\partial g}{\partial y} \end{pmatrix} \begin{pmatrix} \Delta x \\ \Delta y \end{pmatrix} = \begin{pmatrix} f(x, y) \\ g(x, y) \end{pmatrix} \qquad (3)$$

The discretizing operation is carried out by approximation of, for example, a first order differential of $f(x)$ as follows:

$$\partial f / \partial x \approx \frac{f(x+dx, y) - f(x, y)}{dx} \qquad (4)$$

FIG. 2 is a flowchart showing the operation of the simulator of FIG. 1. In step 201, the mesh generator 101 generates meshes used to form discrete expressions from coptinuity equations. In step 202, the concentration profile setter 102 sets a profile of concentrations on the meshes, so that the profile is first used to solve the continuity equations.

In step 203, the initial condition setter 103 sets initial conditions and schedules variables.

Step 204 updates time t. Step 205 prepares the coefficient matrix A and constant vector b of linear equations (Ax =b) that are formed by linearizing and discretizing the continuity equations. Step 206 finds a solution vector x of the linear equations according to a matrix solution method. Step 207 updates the concentration profile according to the solution vector x. Step 208 determines whether or not the solution vector x is sufficiently small. If it is not, steps 205 to 208 are repeated, and if it is, the flow goes to step 209.

Step 209 determines whether or not the time t is equal to a set time. If not, steps 204 to 209 are repeated, and if it is, the post-processor 105 carries out a calculation terminating process in step 210. Steps 204 and 206 to 209 are carried out by the solver 104. Step 205 is carried out by the setter 106. A loop of steps 205 to 208 is a linearization loop for linearizing the continuity equations. A loop of steps 204 to 209 is a time loop for advancing time by $\Delta t$ up to the set time, to handle the time dependency of the equations.

Continuity equations solved by simulators of the prior art are basically equivalent to one another. In spite of this, the prior art develops different calculation codes simulator by simulator. This results in increasing manpower necessary for the development and maintenance of the simulators. Most of the development manpower is assigned to examine the convergence of an iterative solution of continuity equations that are complicated to secure simulation accuracy.

For example, an impurity diffusion process into semiconductor is usually simulated by numerically solving simplest and standard diffusion equations described by S. M. Sze in "VLSI technology," McGraw-Hill Book Company, 1988. These diffusion equations, however, are incapable of simulating actual phenomena when an impurity concentration, in particular, boron (B) or phosphorus (P) concentration is larger than an intrinsic carrier concentration ni at high temperature (diffusion temperature). In this case, the equations are unable to secure simulation accuracy. This problem becomes serious when implanted impurity ions cause influential damage of semiconductor crystal. FIG. 3 compares simulation results with measurements of SIMS with an oxide ($SiO_2$)-film of 38.3 nm thick being formed on a silicon (Si) substrate and with boron ions being implanted thereto at an implantation energy of 30 keV and a dose of $2.5 \times 10^{15}$ cm$^{-2}$, to provide an initial impurity profile. The Si substrate is annealed in a furnace at 950 degrees centigrade for 10 minutes. As shown in the figure, the simulated result underestimates a tail region of the impurity profile and is unable to secure simulation accuracy for the impurity diffusion process.

To solve the problem, H. Park and M. E. Law have disclosed another simulation technique in "J. Appl. Phys.," 72(8), 1992, p. 3431. This technique considers the behavior of point defects (vacancy and interstitial silicon) in a silicon substrate and concludes that impurities react with the point defects, to generate impurity-point defect pairs that diffuse. The technique proposes a pair diffusion model that assumes the reaction between impurities and point defects is in equilibrium. For example, the following reaction formulae are considered:

$$A + I \rightarrow AI \quad (5)$$

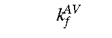
$$A + V \rightarrow AV \quad (6)$$

$$I + V \rightarrow 0 \quad (7)$$

$$I + T \rightarrow IT \quad (8)$$

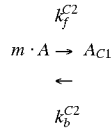
$$m \cdot A \rightarrow A_{Cl} \quad (9)$$

where A represents impurities, I interstitial silicon, V vacancy, T interstitial silicon traps, AI impurity-interstitial silicon pairs, AV impurity-vacancy pairs, IT complexes of interstitial silicon and interstitial silicon traps, Acl impurity clusters, $k_f^{AI}, k_b^{AI}, k_f^{AV}, k_b^{AV}, k_f^{IV}, k_b^{IV}, k_f^{IT}, k_b^{IT}, k_f^{Cel}$, and $k_b^{Cel}$. reaction velocity coefficients, and m the number of impurities, i.e., particles that form an impurity cluster. It is assumed that the reaction formulae (5), (6), and (9) are each in equilibrium and that AI, AV, I, and V diffuse. Then, the following continuity equations consisting of simultaneous partial differential equations are obtained:

$$\frac{\partial C_A}{\partial t} + \nabla(J_{AI} + J_{AV}) = 0 \quad (10)$$

$$\frac{\partial C_I}{\partial t} + \nabla(J_I + J_{AI}) + R_{IV} - R_{IT} = 0 \quad (11)$$

$$\frac{\partial C_V}{\partial t} + \nabla(J_V + J_{AV}) + R_{IV} = 0 \quad (12)$$

$$\frac{\partial N_T}{\partial t} - R_{IT} = 0 \quad (13)$$

where $J_{AI}, J_{AV}, J_I$, and $J_V$ represent fluxes, $R_{IV}$ and $R_{IT}$ recombination terms, $C_A$ a total impurity concentration, $C_I$ a total interstitial silicon concentration, and $C_V$ a total vacancy concentration. These concentrations are defined as follows:

$$C_A = N_A + K_{AI} \cdot N_A \cdot N_I + K_{AV} \cdot N_A \cdot N_V + m \cdot K_{CI} \cdot N_A^m \quad (14)$$

$$C_I = N_I + K_{AI} \cdot N_A \cdot N_I \quad (15)$$

$$C_V = N_V + K_{AV} \cdot N_A \cdot N_V \quad (16)$$

The fluxes $J_{AI}, J_{AV}, J_I$, and $J_V$ are defined as follows:

$$J_{AI} = \frac{D_{AI} \cdot f_i}{N_I^*} [\nabla(N_A \cdot N_I) + Z_A(N_A \cdot N_I)\nabla \ln(n)] \quad (17)$$

$$J_{AV} = \frac{D_{AV}(1 - f_i)}{N_V^*} [\nabla(N_A \cdot N_I) + Z_A(N_A \cdot N_V)\nabla \ln(n)] \quad (18)$$

$$J_I = D_I \cdot \nabla N_I \quad (19)$$

$$J_V = D_V \cdot \nabla N_V \quad (20)$$

where n represents an electron concentration and is defined as follows:

$$n = \frac{\sigma + (\sigma^2 + 4 \cdot n_i^2)^{1/2}}{2} \quad (21)$$

$$\sigma = \Sigma_A Z_A(N_A + K_{AI} \cdot N_A \cdot N_I + K_{AV} \cdot N_A \cdot N_V) \quad (22)$$

where $\Sigma$ is the sum of all impurities.

The recombination terms $R_{IV}$ and $R_{IT}$ are defined as follows:

$$R_{IV} = k_b^{IV}(N_I \cdot N_V - N_I^* \cdot N_V^*) \quad (23)$$

$$R_{IT} = -k_f^{IT} \left[ N_I \cdot N_T - \frac{N_T^* \cdot N_I^*}{N_T^{tot} - N_T^*} (N_T^{tot} - N_T) \right] \quad (24)$$

where NA represents the concentration of the impurities A, $N_I$, the concentration of the interstitial silicon I, $N_V$ the concentration of the vacancy V, $N_T$ the concentration of the interstitial silicon traps T, $D_{AI}$ the diffusion coefficient of the impurity-interstitial silicon pairs $A_I$, $D_{AV}$ the diffusion coefficient of the impurity-vacancy pairs $A_V$, $D_I$ the diffusion coefficient of the interstitial silicon I, $D_V$ the diffusion coefficient of the vacancy V, $N_I^*$ the concentration of equilibrium interstitial silicon, $N_V^*$ the concentration of equilibrium vacancies, $N_T^*$ the concentration of equilibrium interstitial silicon traps, $N_T^{tot}$ the total concentration of interstitial silicon traps, n the concentration of electrons, $Z_A$ the charged state of the impurities A, $f_i$ ($0<=f_i<=1$) the contribution rate of the interstitial silicon to the diffusion of impurities, and $K_{AI}$, $K_{AV}$, and $K_{CA}$ equilibrium constants, which are defined as follows according to the formulae (5), (6), and (9):

$$K_{AI} = k_f^{AI}/k_b^{AI} \quad (25)$$

$$K_{AV} = k_f^{AV}/k_b^{AI} \quad (26)$$

$$K_{Cel} = k_f^{Cel}/k_b^{Cel} \quad (27)$$

In this way, the conventional diffusion simulator employs pair diffusion models and approximates that a reaction of impurity-point defect pairs is in equilibrium. This simulator numerically solves the complicated mass-conservation continuity equations (10) to (27) describing the reaction and transportation of particles.

To numerically solve the continuity equations, it is necessary to determine unknown variables before linearizing and discretizing them. The conventional diffusion simulator with pair diffusion models employs the unknowns $C_A$, $C_I$, $C_V$, and $N_T$. This is because these unknowns make a single time differential term for every continuity equation. This, however, worsens the nonlinearity of space differential terms, to deteriorate the convergence of a linearization loop and increase the number of iterations of the loop. To improve the convergence of the linearization loop, it is necessary to greatly shorten the time intervals Δt of each time loop. FIG. 4 shows changes in the convergence of a nonlinear loop with respect to different ratios of $C_I$ to $C_A$ and different time intervals Δt. The nonlinear loop diverges or oscillates not to provide a solution as the time intervals A t become longer. In the worst case with $C_I/C_A = 1$, a solution will be obtained only with time intervals of $10^{-10}$ minutes or smaller.

This is a serious problem to deny the merit of simulations. For example, a sample is prepared by forming an oxide film of 38.3 nm thick on a silicon substrate and by implanting boron ions through the oxide film to the silicon substrate at an implantation energy of 30 keV and a dose of 2.5 ×10$^{15}$ cm$^{-2}$. Employing an assumed impurity profile and damage profile of this sample, a diffusion simulation is carried out, on the condition that annealing temperature of 850 degrees centigrade. Even by a super computer of 4G FLOPs, to carry out this simulation for annealing time of 0.07 minutes requires two hours of CPU time. Generally, a low-temperature annealing after the high dose ion implantation takes several tens of minutes to two hours. Namely, actually preparing a trial sample is faster than simulating the same.

In this way, the conventional diffusion simulator numerically solves continuity equations, which are complicated to secure simulation accuracy, by employing pair diffusion models and by selecting unknowns so that there is one time differential term in each continuity equation. This technique deteriorates the convergence of an iteration solution.

The conventional simulators are based on essentially same continuity equations expressing a law of mass conservation, which is a physical law. In spite of this fact that the simulators solve mathematically (or physically) identical continuity equations, the actual simulators are separately developed with different calculation codes. Namely, the research and development efforts of the simulators overlap one another, and the simulators require a lot of manpower for maintenance. During the development of each simulator, much time and manpower are spent to solve the problem of convergence.

SUMMARY OF THE INVENTION

An object of the present invention is to provide a simulation method and a simulator, capable of automatically selecting unknowns without deteriorating the convergence of an iterative solution even if continuity equations are complicated to secure simulation accuracy.

Another object of the present invention is to provide a standard simulation method and a simulator, capable of reducing manpower for the development and maintenance of semiconductor devices such as ULSIs and VLSIs without preparing different calculation codes for different simulators.

In order to accomplish the objects, a first aspect of the present invention provides a simulation method including the steps of (a) determining whether or not each reaction formula, which describes a reaction of particles to produce reaction particles (reactants), is in equilibrium and determining unknown variables excluding variables related to the reactants of each equilibrium reaction, (b) forming mass-conservation continuity equations containing time differential terms as functions of the unknown variables and linearizing and discretizing the time differential terms into the coefficient matrix and constant vector of simultaneous linear equations, and (c) solving the linear equations.

The step (a) may include the steps of storing the reaction formulae in a reaction table, storing data indicating the characteristics of the particles expressed with the reaction formula in a particle table, arranging the continuity equations in a sequence according to the reaction table, and preparing unknown indexes to indicate the sequence. The step (b) may include the step of using the reaction table, particle table, and unknown indexes, to incorporate the time differential, space differential, and reaction terms of the continuity equations into the coefficient matrix and constant vector of the simultaneous linear equations.

The continuity equations may be simultaneous partial differential equations comprising reaction rate equations that are functions of the concentrations of particles and reactants related to the reaction formulae, and at least an equation that describes the drifting or diffusing motion of at least one kind of particles or reactants. Solving the simultaneous partial differential equations accurately simulates the manufacturing of semiconductor devices such as ULSIs and VLSIs in a short time. This results in improving the performance of the semiconductor devices and shortening development and research periods. The simultaneous partial differential equations may describe the diffusion of impurities and point defects (vacancies and interstitial atoms) in semiconductor material such as silicon and GaAs.

The present invention precisely simulates an impurity profile in, for example, a silicon substrate that involves interstitial silicon. In this case, the simultaneous partial differential equations may describe the diffusion of point defects and impurities in the substrate on the assumption that the point defects and impurities react to generate point defect-impurity pairs, and that the impurities diffuse when they combine with the point defects. Solving the simultaneous partial differential equations accurately simulates the damage enhanced diffusion or "tail diffusion" of impurities in semiconductor material in a short time.

The simultaneous partial differential equations may include the formulae (5) and (6) in which the reactions are assumed to be in equilibrium, and it is preferable that these equations may describe the diffusion of point defects and impurities in semiconductor material.

Nonlinear time differential terms involving, as unknowns, the concentrations of impurities, interstitial atoms, and vacancies may be linearized and discretized into the coefficient matrix and constant vector of simultaneous linear equations.

A second aspect of the present invention provides a simulator of FIG. 5 for determining a profile of particles, having an unknown index setter 1108 for determining whether or not each reaction formula, which describes a reaction of particles to generate reactants, is in equilibrium and determining unknown variables excluding variables related to the reactants of each equilibrium reaction, a controller 1106 for forming continuity equations containing a plurality of time differential terms as functions of the unknown variables and linearizing and discretizing the time differential terms into the coefficient matrix and constant vector of simultaneous linear equations, and a solver 1104 for solving the linear equations.

The unknown index setter 1108 receives data from a particle table 1110, and the controller 1106 receives data from a reaction table 1109. FIGS. 11A to 11C and 16 show the reaction table 1109. The reaction table 1109 has a column for storing the names of media such as Si, Ge, and GaAs, a column for storing reaction numbers, and a column for storing data. For each of the reaction numbers, which may correspond to the formulae (5) to (9), the data column stores the name of first particles, the number of the first particles, the name of second particles, the number of the second particles, a forward reaction rate coefficient, a backward reaction rate coefficient, an equilibrium constant, and a flag indicating a reaction state. FIG. 17 shows the particle table 1110. The table 1110 has a column for storing the name of particles, a column for storing the names of media (semiconductor substrate), and a column for storing data such as the diffusion coefficient in each medium. The names of particles that diffuse in semiconductor substrate include A for impurities, I for interstitial silicon, V for vacancies, T for interstitial silicon traps, AI for impurity-interstitial silicon pairs, AV for impurity-vacancy pairs, IT for complexes of the interstitial silicon and interstitial silicon traps, and $A_{Cl}$, for impurity clusters. New characteristic data may be added to the data column of the table 1110.

The controller 1106 sends and receives data to and from a time differential term setter 1111, a space differential term setter 1112, and a reaction term setter 1113. The simulator of FIG. 5 is capable of automatically selecting optimum unknowns, to realize the good convergence of an iteration solution and secure simulation accuracy with complicated continuity equations.

The present invention optionally forms continuity equations according to the reaction formulae (5) to (9) each describing a reaction of first and second particles. The present invention linearizes and discretizes the continuity equations into the coefficient matrix and constant vector of simultaneous linear equations. Without developing calculation codes, simulator by simulator, the present invention reduces manpower in developing and maintaining simulators.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION OF THE DRAWINGS

FIG. 4 is a table showing the convergence of simulation of a nonlinear loop according to the prior art employing pair diffusion models;

Figures 14, 15:
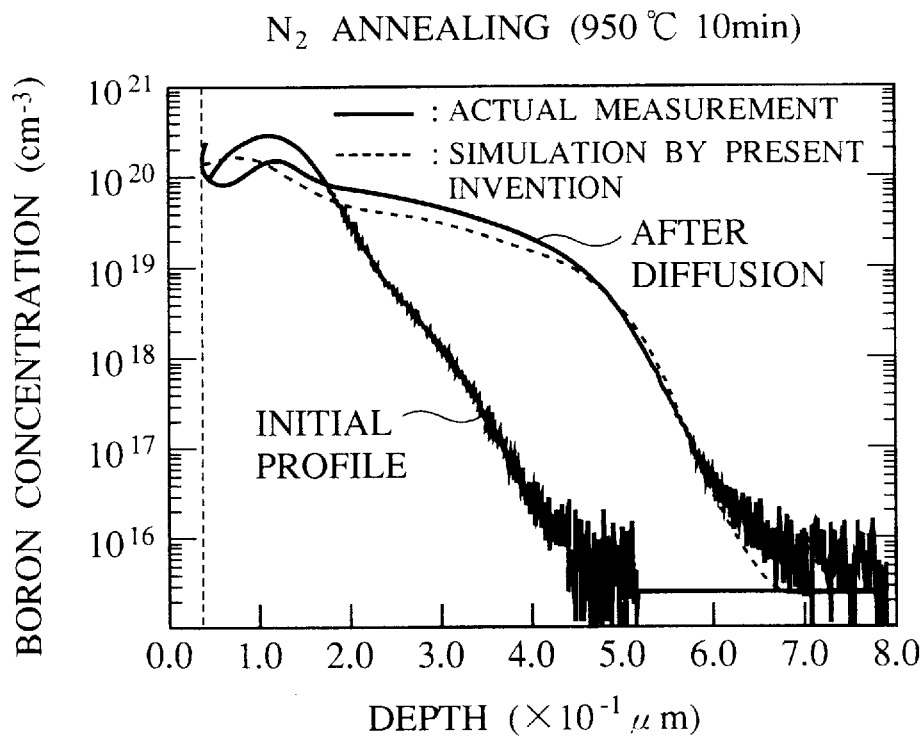
Figure 18:
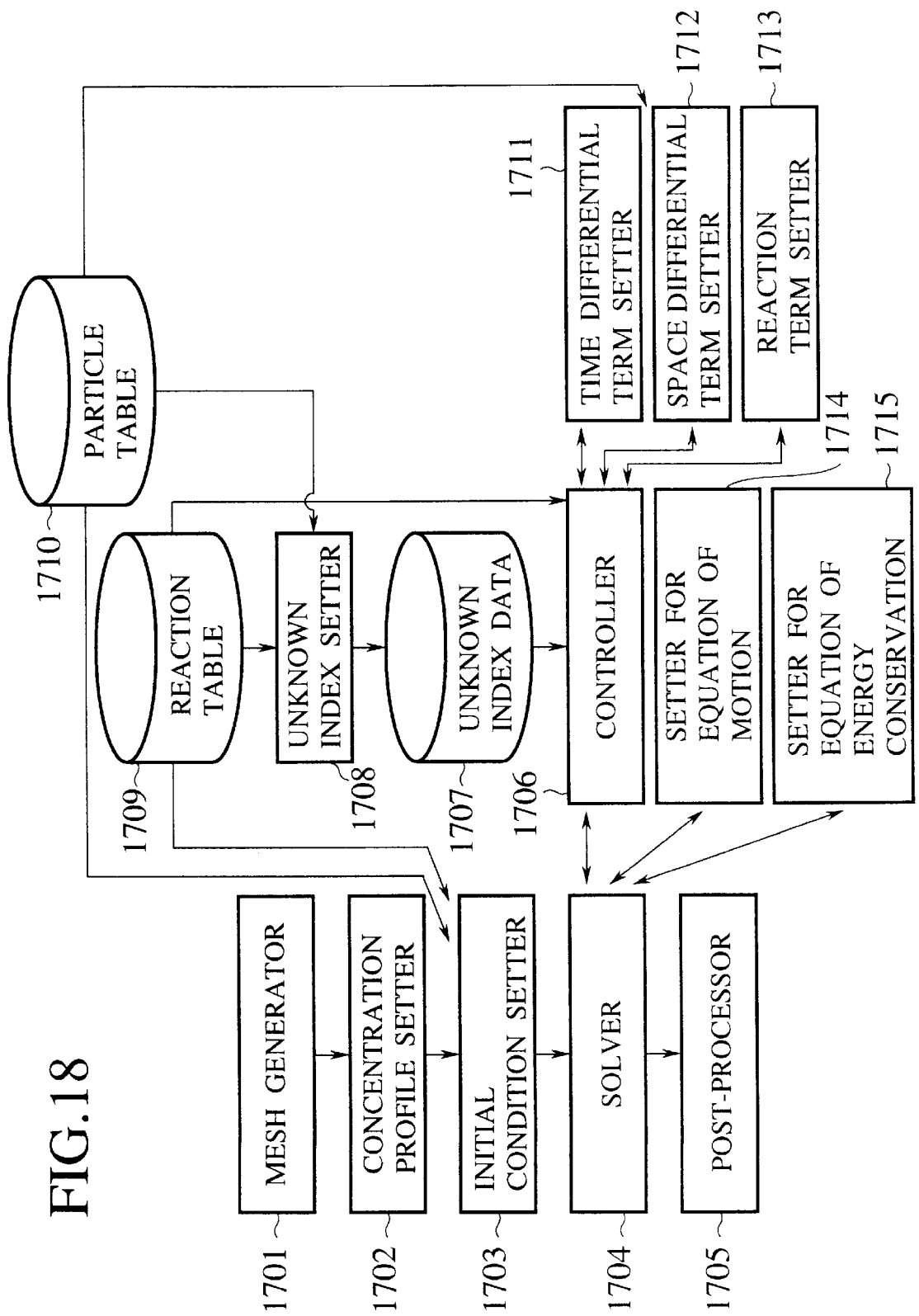
Figure 19:
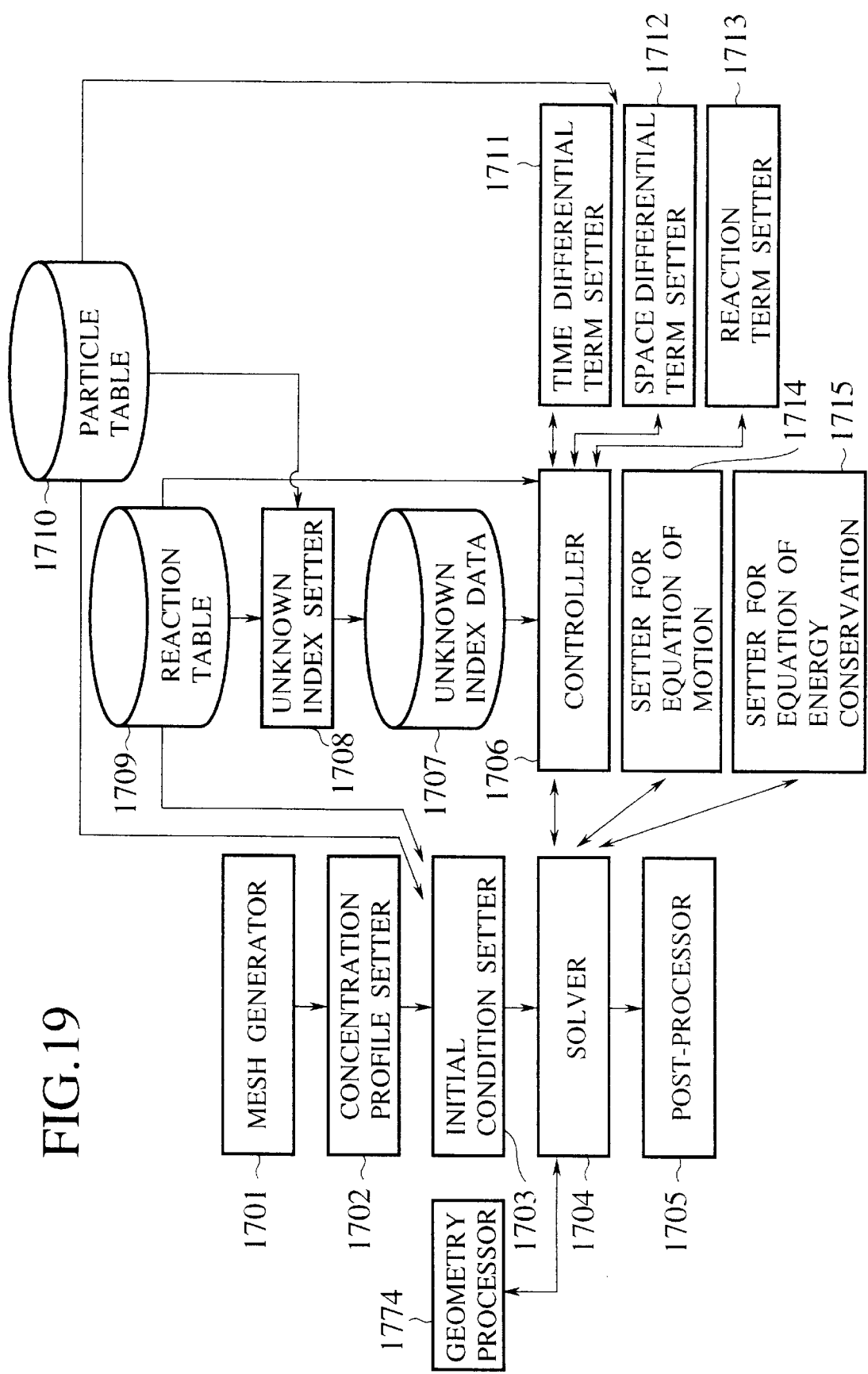
Figure 20A:
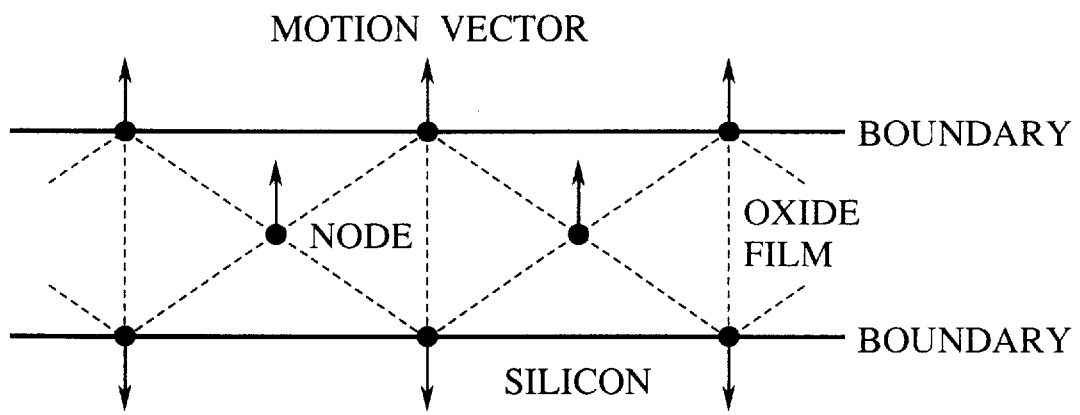
Figure 20B:
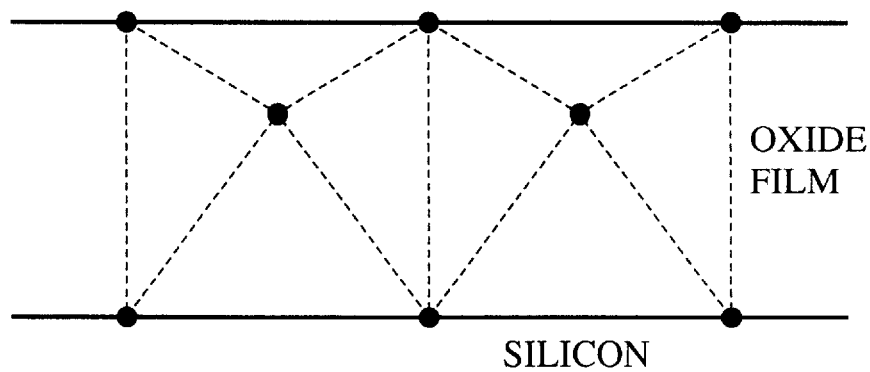
Figure 21:
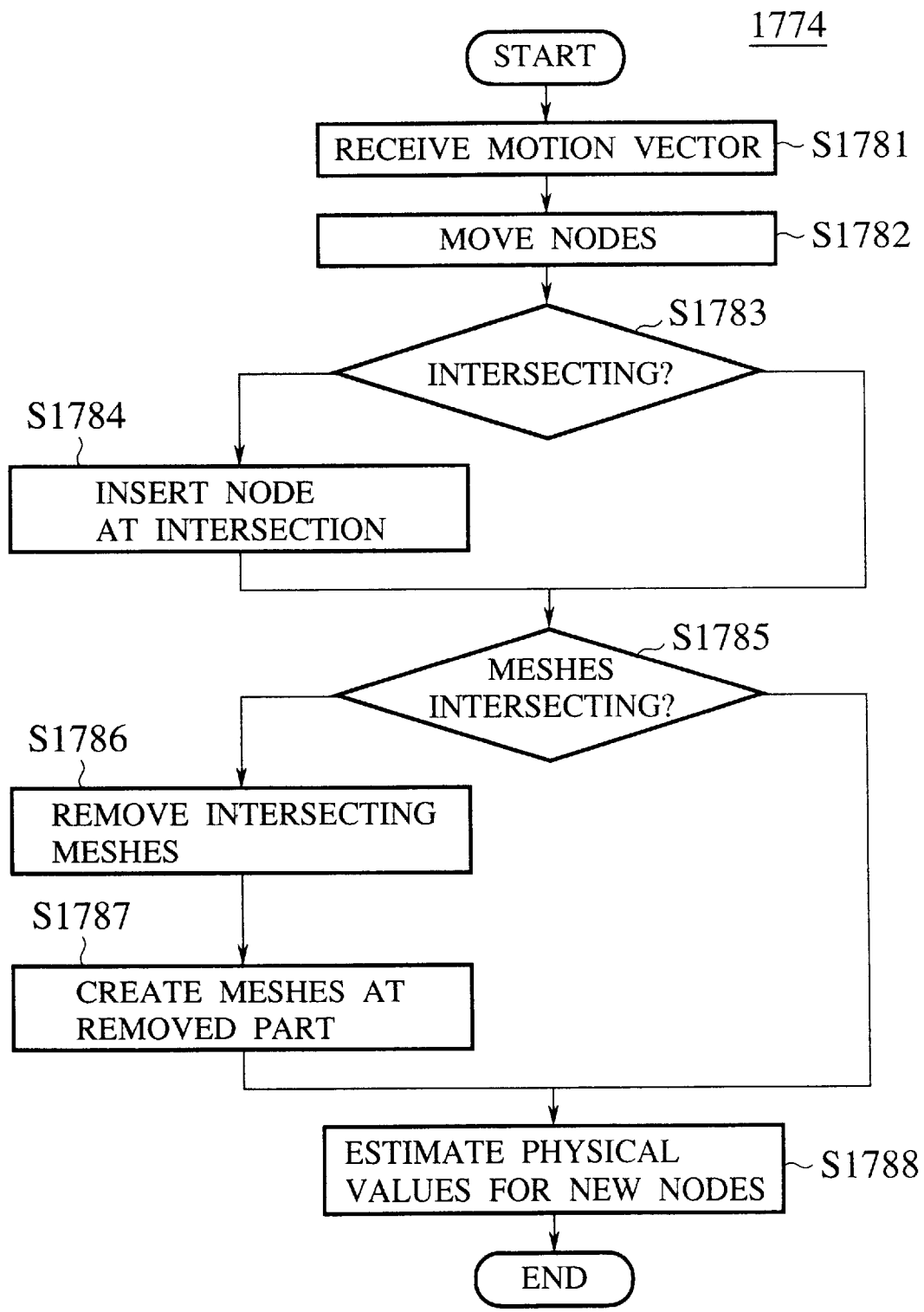
Figure 22A:
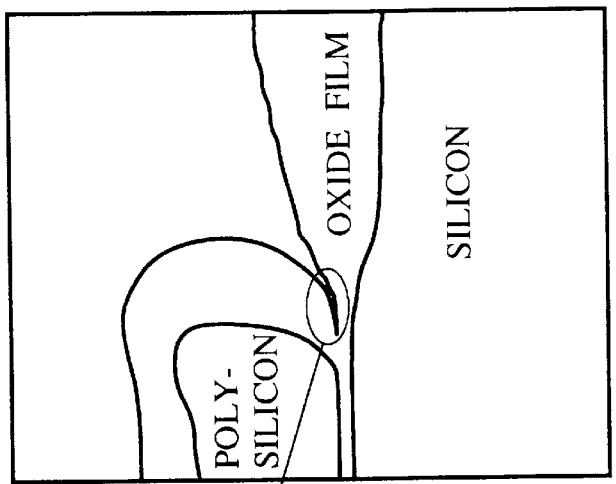

FIDG. 11A to 11C show a reaction table employed by the simulator of the first embodiment;

FIG. 12 shows a particle table employed by the simulator of the first embodiment;

FIG. 13 shows equations formed by the simulator of the first embodiment according to pair diffusion models;

FIG. 14 is a graph showing simulation results according to the first embodiment compared with actual measurements;

FIG. 15 is a table showing the convergence of simulation of a nonlinear loop according to the first embodiment employing pair diffusion models;

FIG. 16 shows a reaction table according to the present invention;

FIG. 17 shows a particle table according to the present invention;

FIG. 18 is a block diagram showing a simulator according to a second embodiment of the present invention;

FIG. 19 is a block diagram showing a simulator according to a modification of the second embodiment, having a geometry processor;

FIGS. 20A and 20B are models showing geometrical changes in the arrangement of particles during an oxidation process;

FIG. 21 is a flowchart showing the operation of the geometry processor;

FIG. 22A is a model showing the vicinity of a gate electrode of a MOSFET; and

FIGS. 22B to 22E show simulations of geometrical changes in an oxide film around the gate electrode edge of the MOSFET.

DETAILED DESCRIPTION OF THE EMBODIMENTS

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

The present invention is achievable with a standard computer system having a CPU, an I/O device such as a keyboard, an external storage device, and an output device such as a display. The CPU carries out various processes according to the present invention, and registers of the CPU and the external storage device store data such as unknown indexes that indicate the sequence of equations.

(First embodiment)

Figure 1:
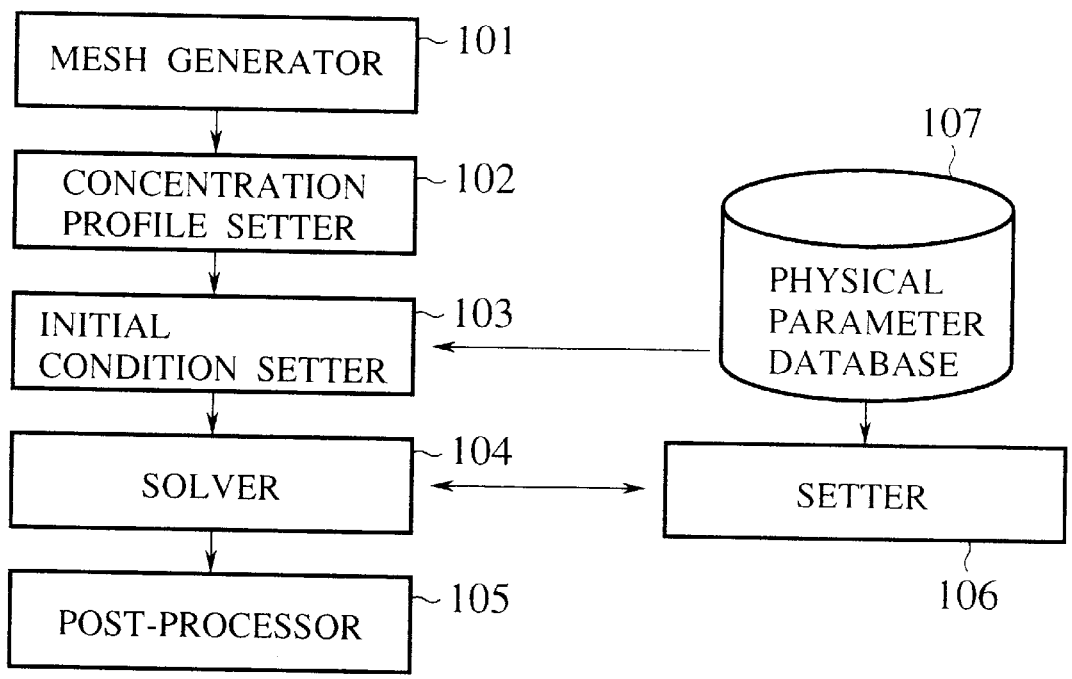
FIG. 1 is a block diagram showing a simulator according to a prior art.
Figure 2:
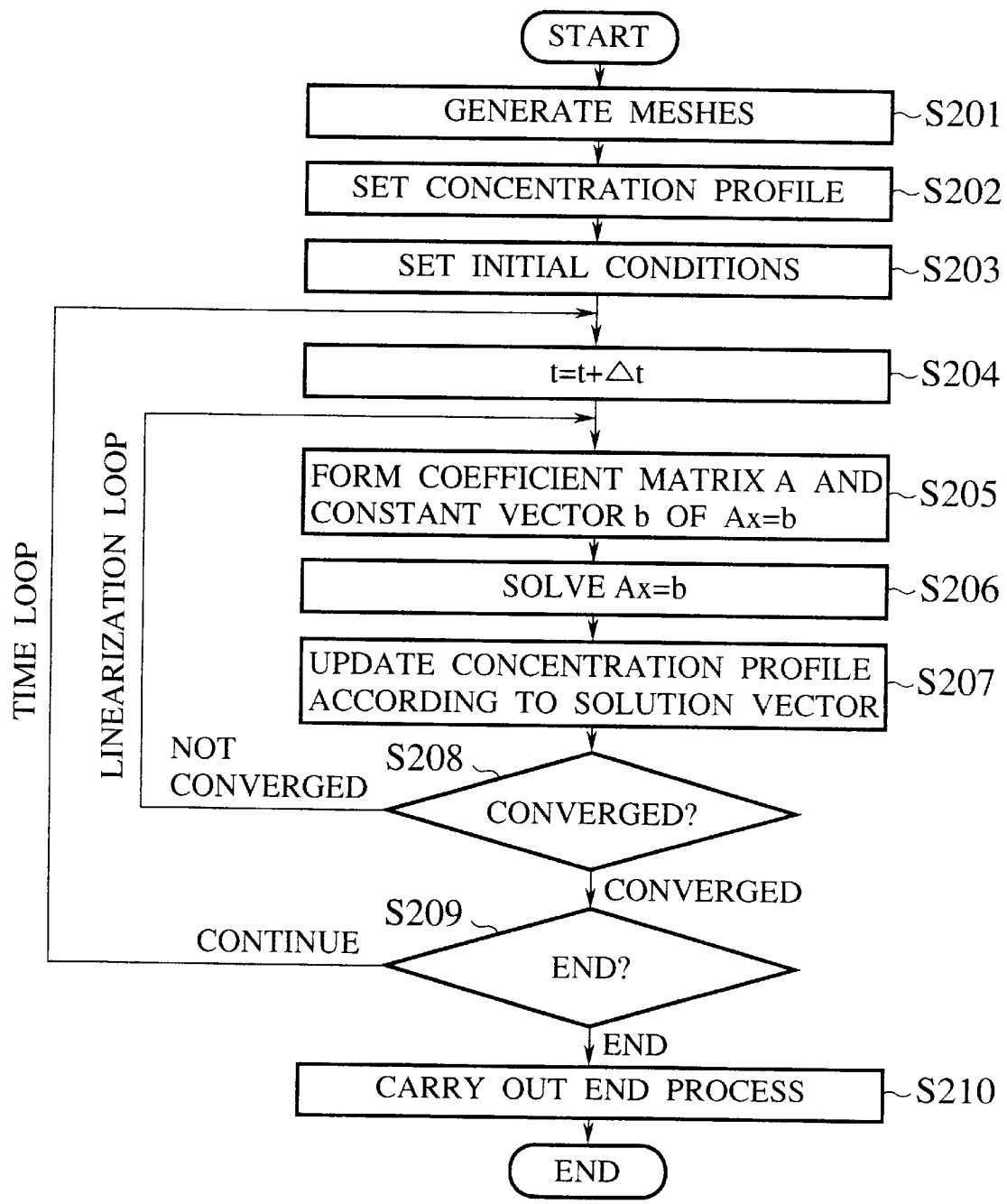
FIG. 2 is a flowchart showing the operation of the simulator of FIG. 1.
Figure 5:
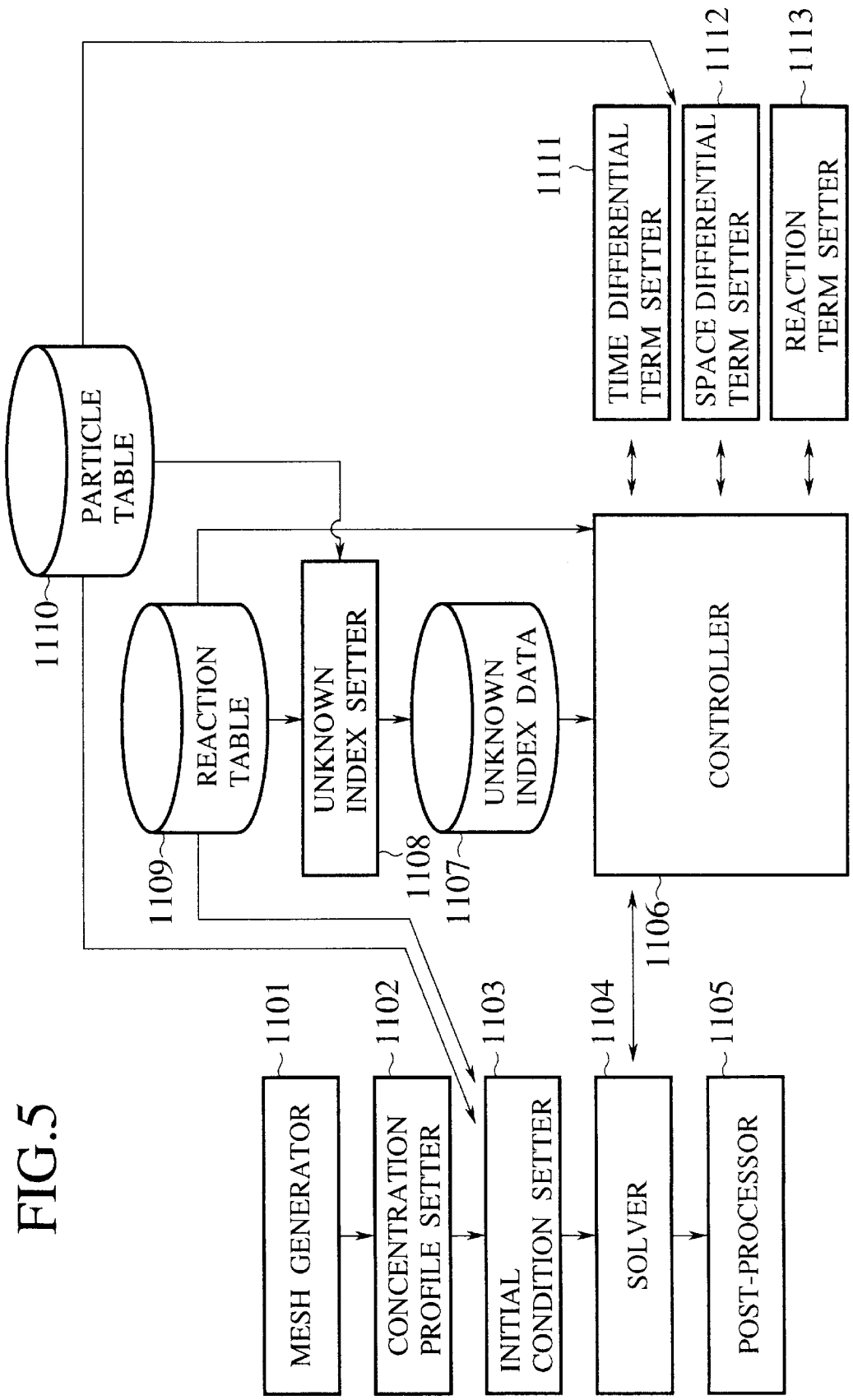
FIG. 5 is a block diagram showing a simulator according to a first embodiment of the present invention.

FIGS. 5 to 15 show a simulation method and a simulator according to the first embodiment of the present invention, in which FIG. 5 is a block diagram showing the simulator. The simulator employs, instead of the setter 106 and database 107 of FIG. 1, a controller 1106 for setting the coefficient matrix and constant vector of simultaneous linear equations that are obtained by linearizing and discretizing continuity equations of mass conservation, unknown index data 1107, an unknown index setter 1108, a reaction table 1109, a particle table 1110, a time differential term setter 1111, a space differential term setter 1112, and a reaction term setter 1113.

The simulation method according to the first embodiment will be explained with reference to the simulator of FIG. 5. Each differential term of equations shown in the following flowcharts is not discrete for the sake of simplicity of the flowcharts.

Figure 6A:
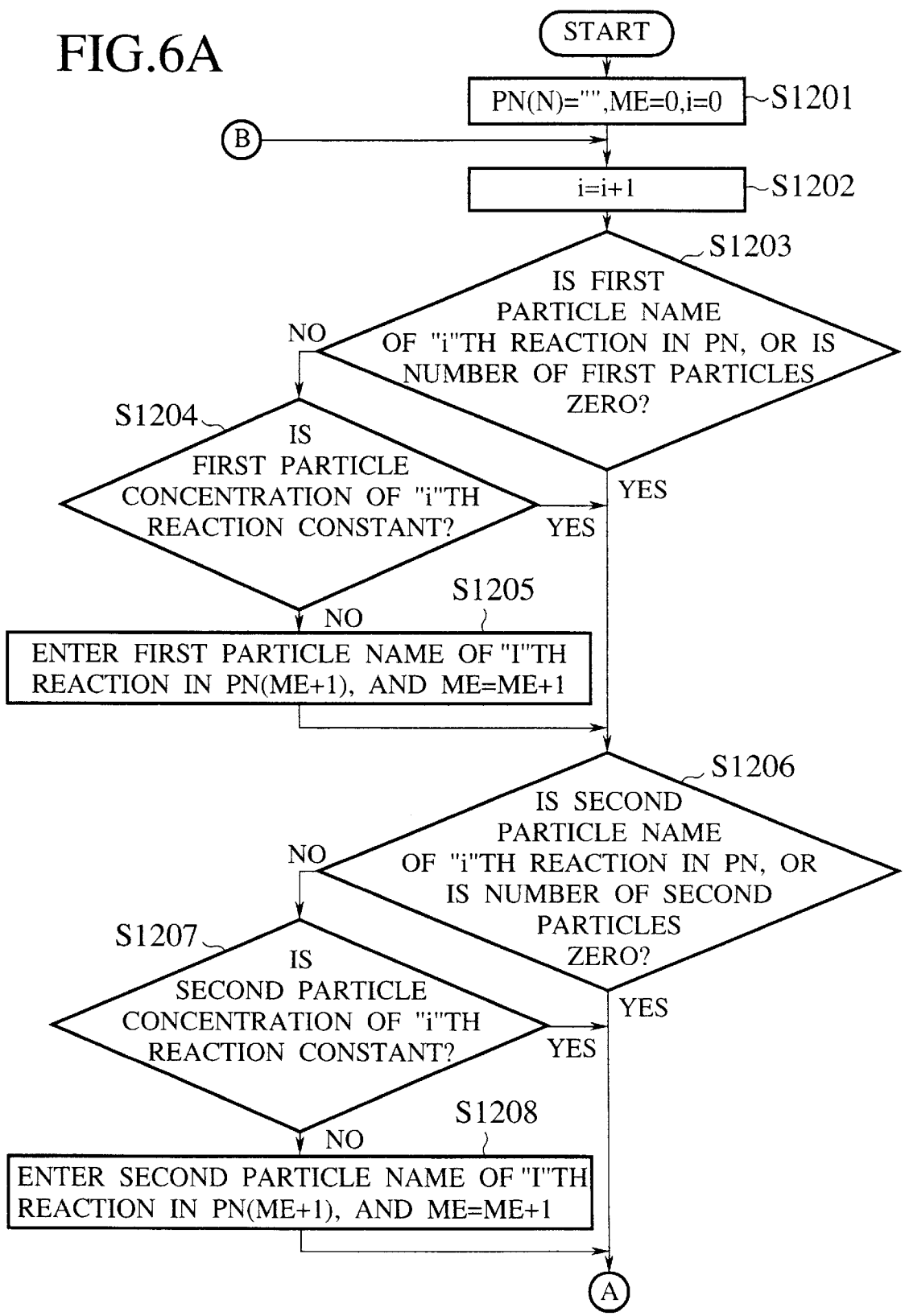
FIGS. 6A and 6B are flowcharts showing the operation of an unknown index setter 1108 of the simulator of the first embodiment.
Figure 6B:
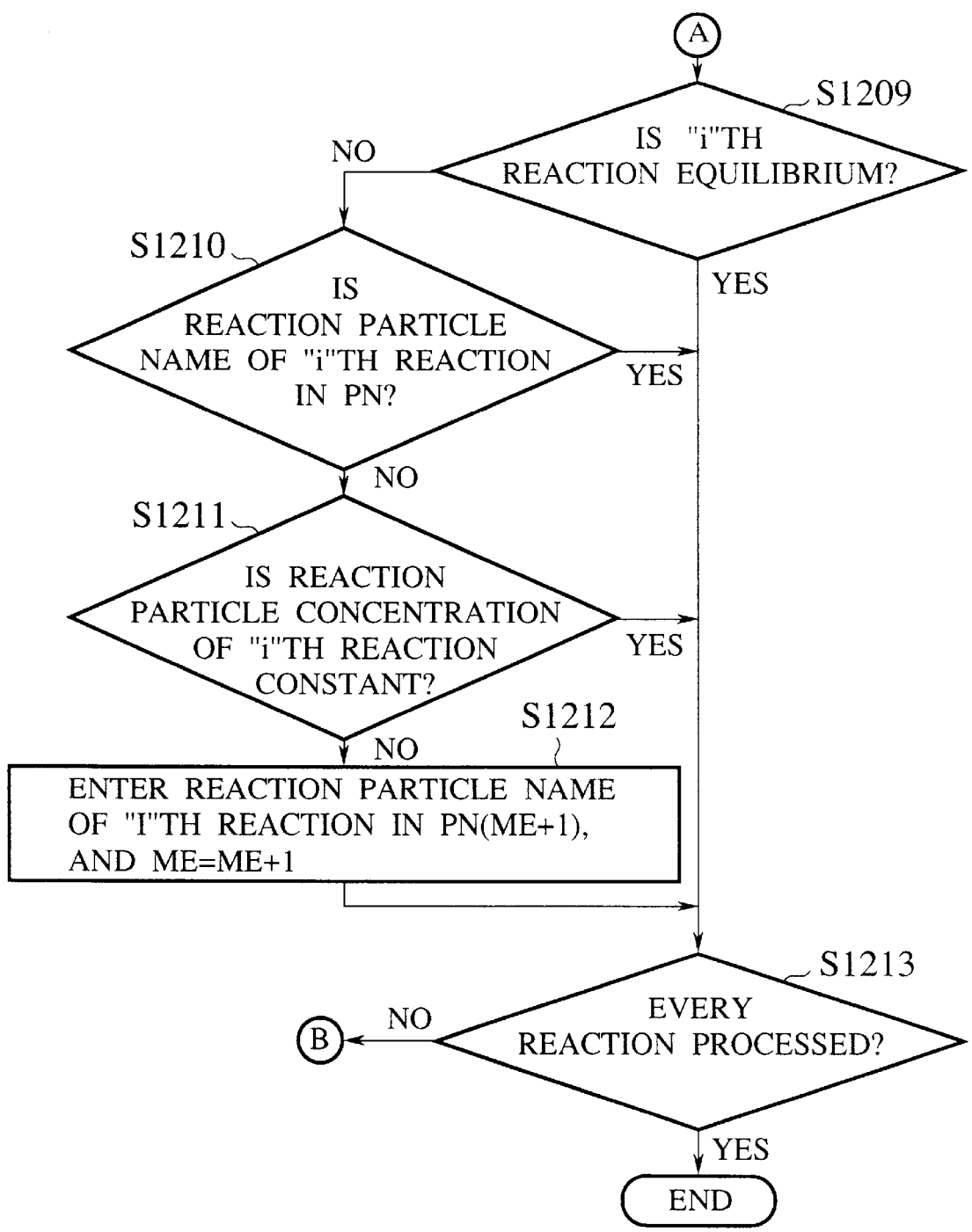

FIGS. 6A and 6B are flowcharts showing the operation of the unknown index setter 1108. Step 1201 nullifies an array of variables PN(N) for storing the names of particles such as A for impurities, I for interstitial silicon, V for vacancies, T for interstitial silicon traps, AI for impurity-interstitial silicon pairs, AV for impurity-vacancy pairs, IT for complexes of the interstitial silicon and interstitial silicon traps, and $A_{CI}$ for impurity clusters. Step 1201 also zeroes a counter variable "ME" for counting the number of unknowns as well as a counter variable "i" for counting reaction numbers. The reaction numbers correspond to, for example, the formulae (5) to (9) each indicating a reaction between first and second particles. The reference mark (N) in PN(N) indicates that there are N elements in the variable array PN(N). Step 1202 increments the reaction number "i" by one (i =i +1). Step 1203 refers to the reaction table 1109 of Figs. 11A to 11C (the reaction table being referred to whenever data related to a reaction formula is needed) and determines whether or not the name of first particles of the "i"th reaction is set in the variable array PN(N) and whether or not the number of the first particles is zero. If step 1203 provides YES, the flow goes to step 1206.

If step 1203 provides NO, step 1204 refers to the particle table 1110 of FIG. 12 and determines whether or not the concentration of the first particles of the "i"th reaction is constant. If it is constant, the flow goes to step 1206, and if not, step 1205 sets the name of the first particles of the "i"th reaction in the variable PN(ME+l), and the counter variable ME is incremented by one (ME =ME +1). Step 1206 determines whether or not the name of second particles of the "i"th reaction is set in the variable array PN(N) and whether or not the number of the second particles is zero. If step 1206 provides YES, the flow goes to step 1209.

If step 1206 provides NO, step 1207 refers to the particle table 1110 and determines whether or not the concentration of the second particles of the "i"th reaction is constant. If it is constant, the flow goes to step 1209, and if not, step 1208 sets the name of the second particles of the "i"th reaction in the variable PN(ME+1) and increments the counter variable ME by one (ME =ME +1).

Step 1209 determines whether or not the "i"th reaction is in equilibrium. If it is in equilibrium, the flow goes to step 1213, and if not, step 1210 determines whether or not the name of reactants of the "i"th reaction is set in the variable array PN(N). If it is set, the flow goes to step 1213, and if not, step 1211 determines whether or not the concentration of the reactants of the "i"th reaction is constant. If it is constant, the flow goes to step 1213, and if not, step 1212 sets the name of the reactants of the "i"th reaction in the variable PN(ME+l) and increments the counter variable ME by one (ME =ME +1). Step 1213 determines whether or not every reaction stored in the reaction table 1109 has been processed. If not, steps 1202 to 1213 are repeated. If step 1213 provides YES, unknown indexes have been set, and therefore, the routine ends. In this way, the variable array PN(N) for storing particle names and the counter variable ME for unknowns are set. The variables in the array PN(N) serve as unknown indexes indicating the sequence of equations shown in FIGS. 7 to 10, and the counter variable "ME" indicates the total number of unknowns. If the variable PN(i) stores "A", the turn of an equation related to the particles A is "i".

Figure 7:
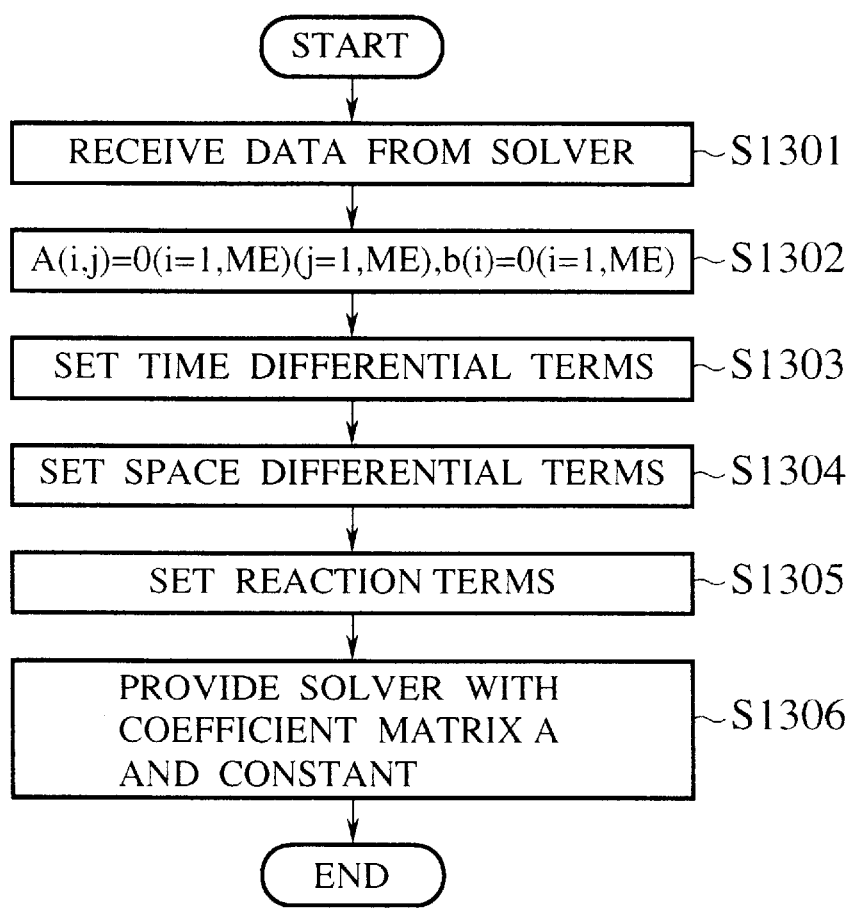
FIG. 7 is a flowchart showing the operation of a controller 1106 of the simulator of the first embodiment.

FIG. 7 is a flowchart showing the operation of the controller 1106 for setting the coefficient matrix and constant vector of simultaneous linear equations that are obtained by linearizing and discretizing continuity equations. The controller 1106 controls the time differential term setter 111, space differential term setter 1112, and reaction term setter 1113. Step 1301 receives data such as time slicing data from the solver 1104. Step 1302 initializes all elements of a coefficient matrix A and constant vector b to zero. Step 1303 provides the time differential term setter 1111 with the coefficient matrix A, constant vector b, time slicing data, and unknown indexes, etc., and receives the coefficient matrix A and constant vector b processed by the setter 1111. Similarly, steps 1304 and 1305 provide the space differential term setter 1112 and reaction term setter 1113 with the coefficient matrix A, constant vector b, unknown indexes, etc., and receive the coefficient matrix A and constant vector b processed by the setters 1112 and 1113. Step 1306 provides the solver 1104 with the finished coefficient matrix A and constant vector b.

Figure 8:
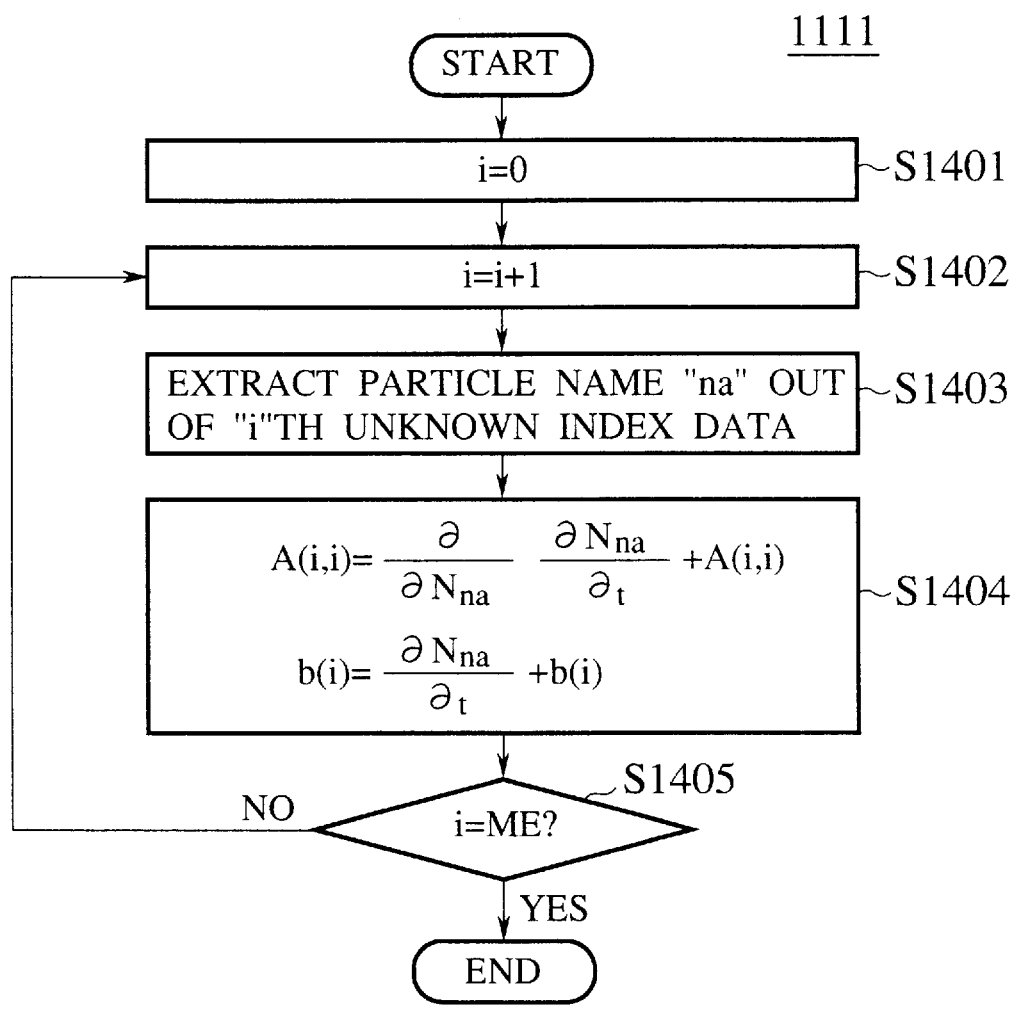
FIG. 8 is a flowchart showing the operation of a time differential term setter 1111 of the simulator of the first embodiment.

FIG. 8 is a flowchart showing the operation of the time differential term setter 1111. Step 1401 initializes the counter variable "i" for counting equation numbers to zero. Step 1402 increments the counter variable "i" by one (i =i +1). Step 1403 extracts a particle name "na" out of the unknown index PN(i). Step 1404 incorporates a time different ($\partial N_{na}/\partial t$) of the concentration $N_{na}$ of the particles "na" into coefficient matrix A(i, i) and constant vector b(i). Step 1405 determines whether or not all particles stored in the unknown indexes have been processed. If any one of them is not processed yet, steps 1402 to 1405 are repeated. If step 1405 provides YES, the routine ends.

Figure 9A:
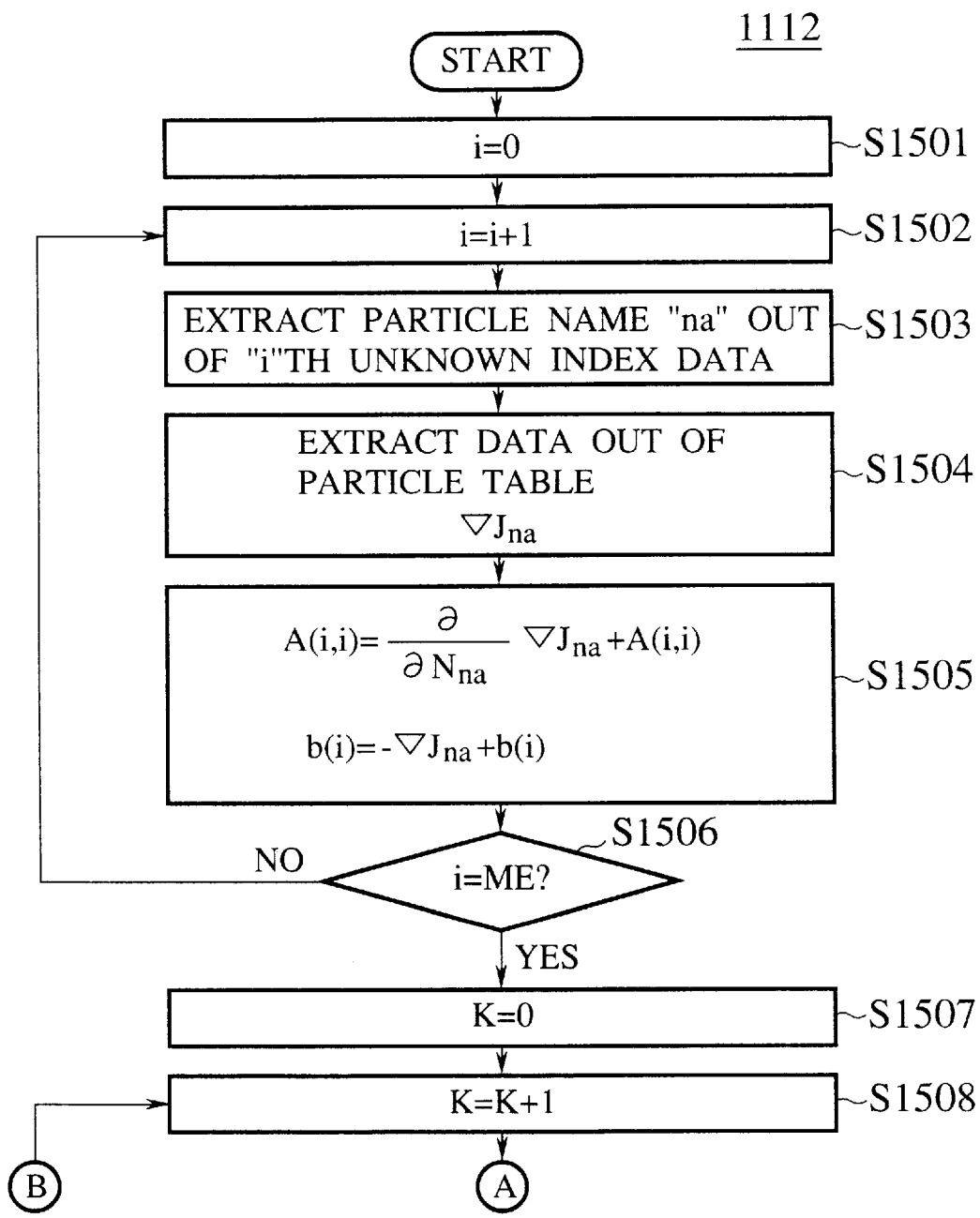
FIGS. 9A and 9B are flowcharts showing the operation of a space differential term setter 1112 of the simulator of the first embodiment.
Figure 9B:
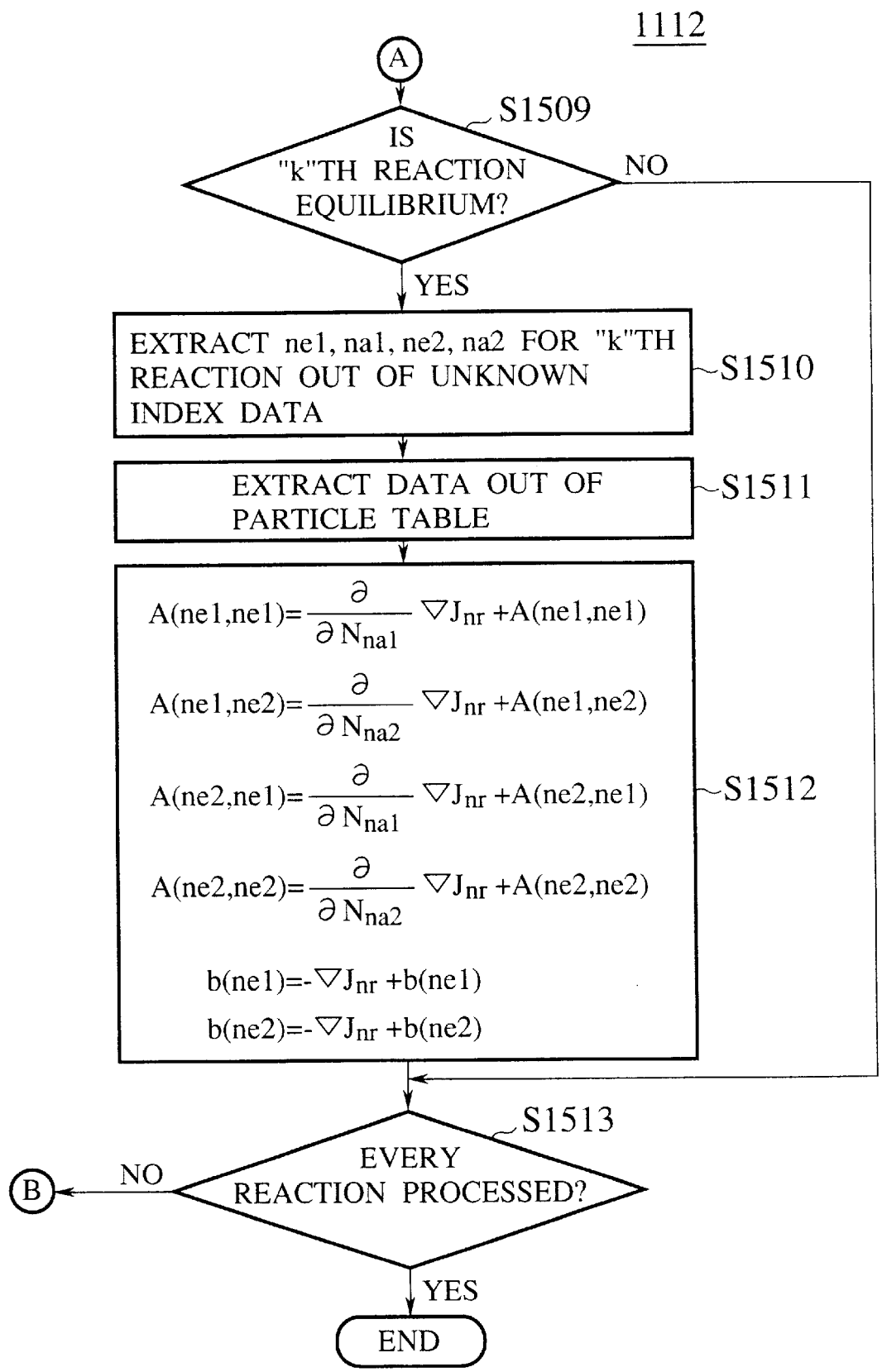

FIGS. 9A and 9B are flowcharts showing the operation of the space differential term setter 1112. Step 1501 initializes the counter variable "i" for counting equation numbers to zero. Step 1502 increments the counter variable "i" by one (i =i +1). Step 1503 extracts a particle name "na" out of the unknown index PN(i). Step 1504 extracts physical values out of the particle table 1110, so that step 1505 may set $\nabla J_{na}$ for a diffusion coefficient, etc. Step 1505 incorporates the space differential term ($\nabla J_{na}$) of a flux consisting of the particles "na" into coefficient matrix A(i, i) and constant vector b(i).

Step 1506 determines whether or not all particles stored in the unknown indexes have been processed. Namely, step 1506 checks to see if i =ME. If it is not, steps 1502 to 1506 are repeated.

If step 1506 determines that i =ME, step 1507 initializes a counter variable "k" for counting reaction numbers to zero. Step 1508 increments the counter variable k by one (k =k +1). Step 1509 determines whether or not the "k"th reaction is in equilibrium. If it is not, the flow goes to step 1513, and if it is, step 1510 extracts, out of the unknown indexes, the equation number "ne1" and name "na1" of first particles of the "k"th reaction, as well as the equation number "ne2" and name "na2" of second particles of the "k"th reaction. Step 1511 extracts physical values such as a diffusion coefficient out of the particle table 1110 so that the next step may set a space differential term ($\nabla J_{nr}$). Step 1512 incorporates the space differential term ($\nabla J_{nr}$) of reactants "nr" of the "k"th reaction into coefficient matrix A and constant vector b at positions indicated with the equation number "ne1" of the first particles and the equation number "ne2" of the second particles.

Step 1513 determines whether or not all reactions stored in the reaction table 1109 have been processed. If not, steps 1508 to 1513 are repeated. If step 1513 provides YES, the routine ends.

Figure 10:
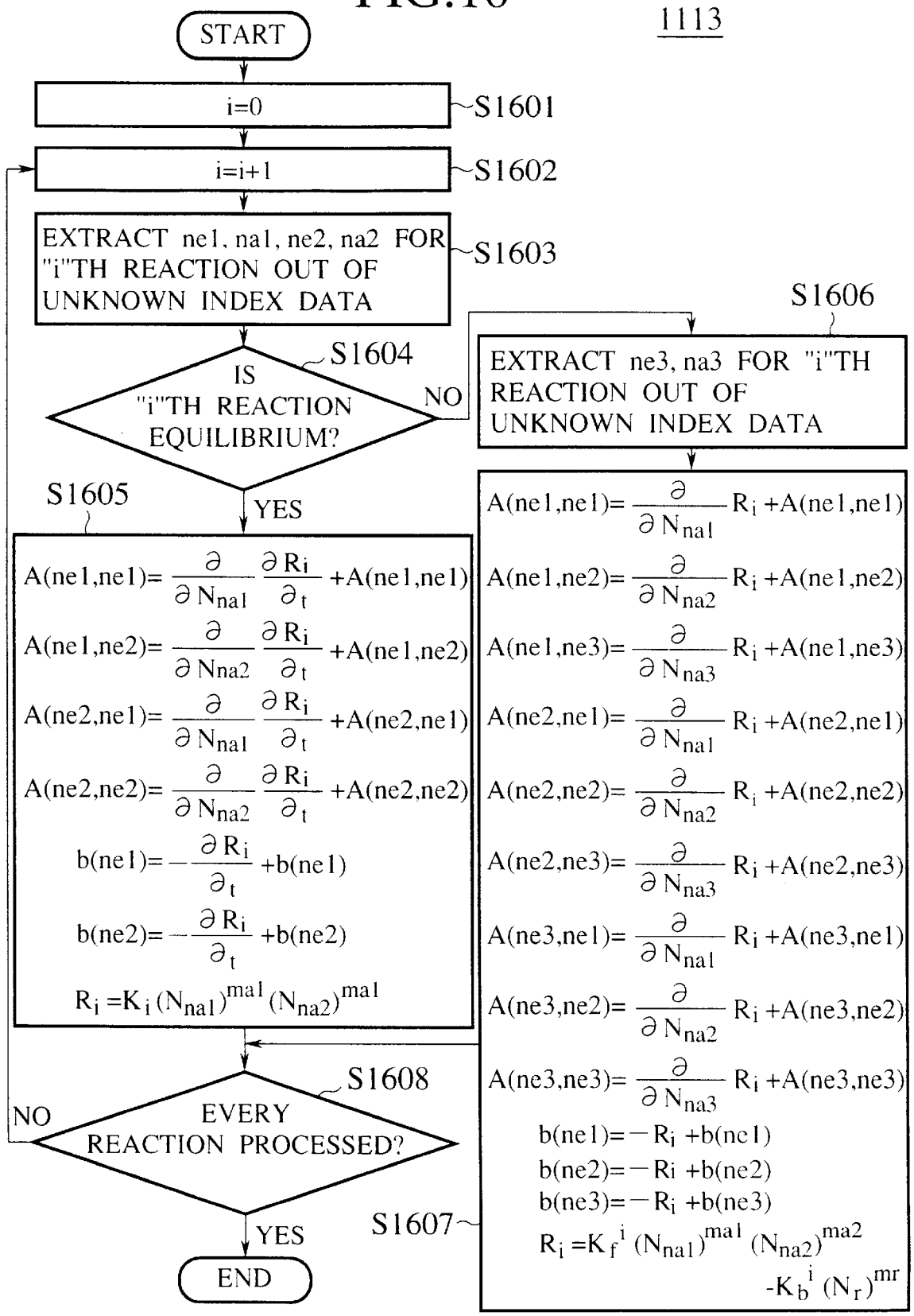
FIG. 10 is a flowchart showing the operation of a reaction term setter 1113 of the simulator of the first embodiment.

FIG. 10 is a flowchart showing the operation of the reaction term setter 1113. Step 1601 initializes the counter variable "i" for counting reaction numbers to zero. Step 1602 increments the counter variable "i" by one (i =i +1). Step 1603 extracts, out of the unknown indexes PN(i), the equation number "ne1" and name "na1" of first particles of the "i"th reaction, as well as the equation number "ne2" and name "na2" of second particles of the "i"th reaction. Step 1604 determines whether or not the "i"th reaction is in equilibrium. If it is, step 1605 incorporates the time differentials of equilibrium conditional equations between the reactants and the first and second particles of the "i"th reaction into coefficient matrixes and constant vectors corresponding to the equation numbers "ne1" and "ne2." Thereafter, step 1608 is carried out. If step 1604 provides NO, step 1606 extracts the equation number "ne3" and name "na3" of reactants of the "i"th reaction. Step 1607 incorporates the reaction terms of the "i"th reaction into coefficient matrixes A and constant vectors b. Step 1608 determines whether or not all reactions stored in the reaction table 1109 have been processed. If not, steps 1602 to 1608 are repeated. If step 1608 provides YES, the routine ends.

The first embodiment of the present invention is applicable to the conventional diffusion simulation in semiconductor employing pair diffusion models. This will be explained. Figures 11A to 11C show the reaction table 1109 in which reaction numbers 1 to 5 correspond to the reaction formulae (5) to (9), respectively. The conventional method assumes that the reactions of the formulae (5), (6), and (9) are each in equilibrium, and therefore, a variable indicating a reaction state of each of the reaction numbers 1, 2, and 5 is "1." FIG. 12 shows the particle table 1110 based on the pair diffusion models. Each kind of particles has a diffusion coefficient, an equilibrium concentration, and a constant concentration condition. In FIG. 12, a reference mark "-" means that nothing is set.

The unknown indexes PN(i) are set for the reaction table 1109 according to the algorithm of FIGS. 6A and 6B as follows:

PN(1) =A

PN(2) =I

PN(3) =V

PN(4) =T

The unknown indexes PN(i) indicate that the concentrations NA, NI, NV, and NT of these particles will be unknown variables. Each element number of the array PN(i) corresponds to the continuity equation number of the particles in question.

Setting equations by the setters 1111, 1112, and 1113 according to the algorithms of FIGS. 8 to 10 will be explained with reference to FIG. 13. The particles A, I, V, and T are related to continuity equations $F_A$, $F_I$, $F_V$, and $F_T$, respectively. The algorithm of the time differential term setter 1111 of FIG. 8 is carried out under the control of the controller 1106 and sets time differential terms 1901 for the particles A, I, V, and T. Steps up to step 1506 of FIG. 9A of the space differential term setter 1112 set space differential terms 1902, i.e., $\nabla J_I$, and $\nabla J_V$. When the algorithm of the space differential term setter 1112 is complete, space differential terms 1903, i.e., $\nabla J_{AI}$ and $\nabla J_{AV}$ are set. Step 1607 of FIG. 10 of the reaction term setter 1113 sets reaction terms 1904, and step 1605 thereof sets time differential terms 1905 of the particles that are each in equilibrium.

Figure 3:
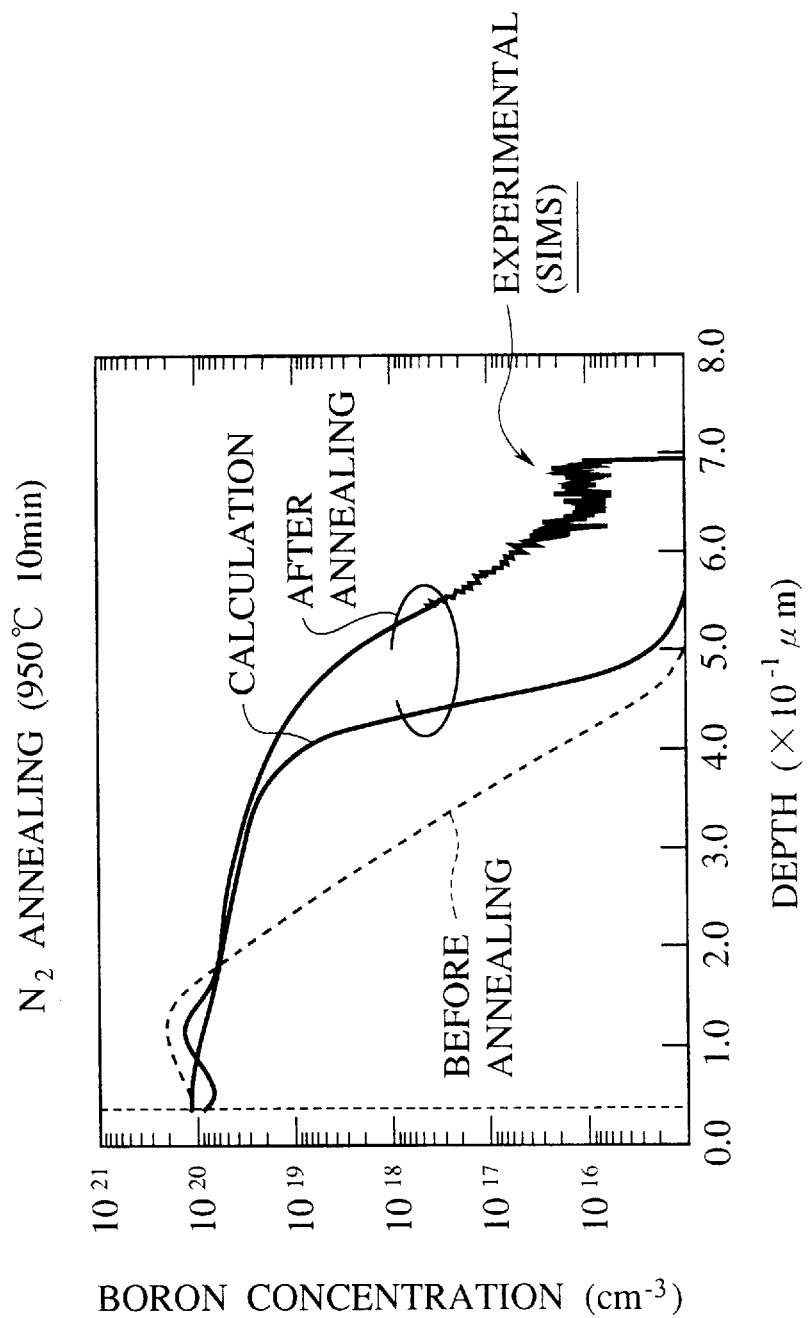
FIG. 3 is a graph showing the simulation accuracy of the prior art compared with actual measurements.

FIG. 14 corresponds to FIG. 3 of the prior art and shows a result of simulation according to the first embodiment of the present invention compared with actual measurements. The simulation according to the first embodiment correctly simulates a tail region of the actual profile of impurity diffusion. This is because the first embodiment takes the behavior of point defects (vacancies and interstitial silicon) in a semiconductor (such as silicon) substrate into account and assumes that the point defects react with impurities to form impurity-point defect pairs and diffuse. The first embodiment assumes that this reaction is in equilibrium when forming the pair diffusion models.

FIG. 15 shows the convergence of simulation of a non-linear loop according to the first embodiment of the present invention carried out under the same conditions as the prior art of FIG. 4. The present invention provides a solution after 30 iterations or smaller even if the time intervals Δt are large. The time necessary for carrying out the simulation of FIG. 14 is about five to six minutes with an EWS of SPEC FP65. On the other hand, the prior art simulates only for 0.07 minutes of annealing time in two hours of CUP time even with a super computer of 4G FLOPs. Accordingly, the simulation time of the present invention is greatly faster than the prior art. In consideration of the computation speed of the computers, the present invention is at least 1000 times faster than the prior art.

As explained above, the first embodiment of the present invention determines whether or not each reaction between particles to generate reactants is in equilibrium, determines unknown variables excluding variables related to the reactants of each equilibrium reaction, and numerically solves mass-conservation continuity equations that contain at least the unknown variables. Even if the continuity equations are complicated to secure simulation accuracy, the present invention provides a good convergence of an iterative solution. The first embodiment of the present invention reduces manpower for developing and maintaining simulators because it avoids a useless development of calculation codes for different simulators.

(Second embodiment)

A simulation method and a simulator according to the second embodiment of the present invention will be explained with reference to FIGS. 18 to 22E. This embodiment is applicable to simulate thermal fluid in a vapor phase reaction. For example, the second embodiment is applicable to simulate gas flows in an oxidation furnace, a diffusion (predeposition) furnace, a vapor phase epitaxial growth (VPE) furnace, or a CVD furnace for the manufacturing processes of the semiconductor devices. To completely express the state of fluid, it is necessary to know various physical values that characterize a flow field. Basically, it ends to solve equations of continuity, motion, and energy that express the conservation of mass, momentum, and energy. The composing parts of the simulator in the second embodiment, in addition to those of the first embodiment, will be explained. A setter 1714 sets coefficient matrixes and constant vectors related to the following partial differential equation expressing the conservation of momentum:

$$\frac{\partial}{\partial t}(\rho^\alpha v_i^\alpha) + \frac{\partial}{\partial x_i}(\rho^\alpha v_i^\alpha v_i^\alpha) = \frac{\partial}{\partial x_j}(\pi_{ij}^\alpha) + \rho^\alpha m_i^\alpha \quad (28)$$

$$\pi_{ij}^\alpha = -p^\alpha \delta_{ij} + \tau_{ij}^\alpha \quad (29)$$

$$p^\alpha = \frac{\rho^\alpha}{m_\alpha} RT \quad (30)$$

A unit 1715 sets coefficient matrixes and constant vectors related to the following partial differential equation expressing the conservation of energy:

$$\frac{\partial}{\partial t}\left\{\rho^\alpha\left(e^\alpha + \frac{1}{2}v_k^\alpha v_k^\alpha\right)\right\} +$$

$$\frac{\partial}{\partial x_j}\left\{\rho^\alpha\left(e^\alpha + \frac{1}{2}v_k^\alpha v_k^\alpha\right)v_j^\alpha\right\} = \frac{\partial}{\partial x_j}(\pi_{ij}^\alpha v_i^\alpha) - \frac{\partial q_i^\alpha}{\partial x_i} + \rho^\alpha e^\alpha \quad (31)$$

where $\rho$ is a concentration, v is a velocity, e is internal energy, $m_i^\alpha$ is production momentum, $\pi_{ij}^\alpha$ is stress, $\tau_{ij}^\alpha$ is viscosity stress, $e^\alpha$ is generation energy, $g_i^\alpha$ is a thermal velocity, and a superscript suffix a is a particle name.

The second embodiment numerically solves these equations and the equation of continuity expressing mass conservation, to simulate gas flows in the oxidation furnace, diffusion furnace, VPE furnace, or CVD furnace.

FIG. 19 shows a simulator having a geometry processor 1774 in addition to the arrangement of FIG. 18, to simulate a change in the geometry of a semiconductor device during, for example, an oxidation process. When silicon substrate for a semiconductor device is oxidized, the volume of the substrate expands to change the geometry of the device. To simulate an oxidation process of a semiconductor device, the equations (28) to (30) must be solved in an oxide ($SiO_2$) film, to find motion vectors at nodes as shown in FIG. 20A. According to the motion vectors, the boundaries and discrete meshes indicating the geometry of the $Sio_2$ and silicon film are changed in each time slice, to perform the simulation.

FIG. 21 is a flowchart showing the operation of the geometry processor 1774. Step 1781 receives, from the solver 1704, solutions of the equations (28) to (30), i.e., motion vectors at nodes. Step 1782 adds the motion vectors to position vectors at the nodes, to thereby move the nodes. Step 1783 determines whether or not boundaries intersect each other. If they intersect each other, step 1784 inserts a node at each intersection, and step 1785 is carried out. If they do not intersect each other, step 1785 is carried out after step 1783.

Step 1785 determines whether or not meshes intersect each other. If they intersect, step 1786 deletes the intersecting meshes, and step 1787 generates new meshes at the part where the meshes have been deleted. Then, step 1788 is carried out. If the meshes are triangles, it is preferable not to create dull triangles. If step 1785 determines that there are no meshes intersecting one another, step 1788 is carried out. If there is any new node, step 1788 estimates the physical values of the node by interpolating known physical values. Then, the routine ends.

Figure 22E:
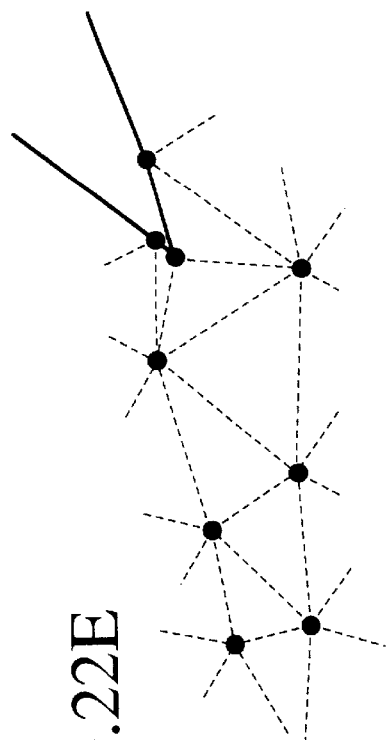
Figure 22B:
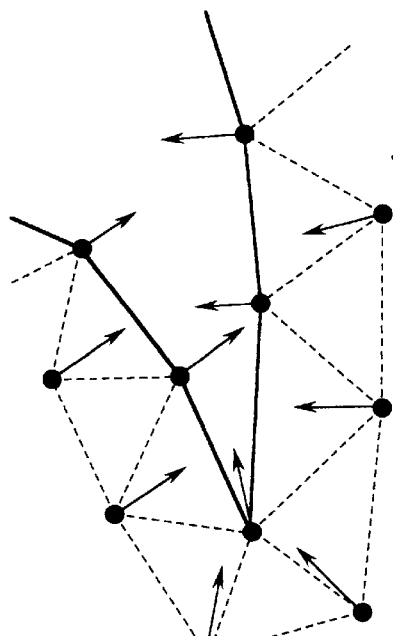
Figure 22C:
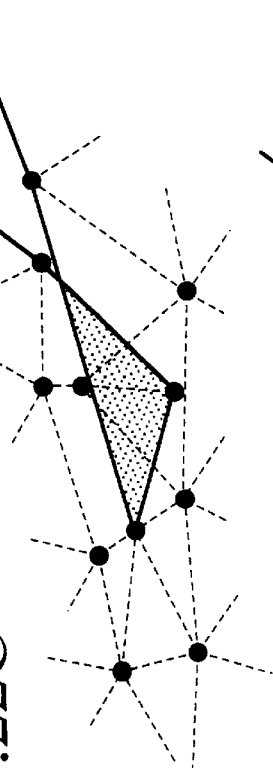
Figure 22D:
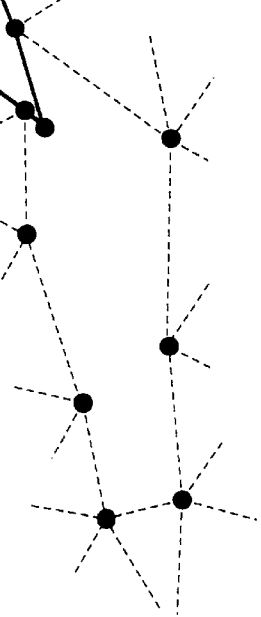

The processes following step 1782 occur rarely in the oxidation of a flat surface, but frequently in the oxidation of silicon device having a shape with corners. For example, in a post-oxidation process of polisilicon gate in a MOSFET shown in FIG. 22A, the processes following step 1782 occur at an encircled corner in the vicinity of polysilicon gate edge. FIGS. 22B to 22E are models according to the algorithm of FIG. 21. FIG. 22B shows motion vectors at nodes received in step 1781. FIG. 22C shows intersections caused by moving nodes in step 1782. FIG. 22D shows a state after carrying out steps 1784 to 1786. FIG. 22E shows a state after carrying out step 1787.

The geometry processing of the second embodiment processes only intersecting parts, if any. However, it is possible to process boundaries that intersect each other and regenerate meshes all over an oxide ($SiO_2$) film.

The setters 1714 and 1715 of the simulator of FIG. 18, having a function of setting the coefficient matrixes and constant vectors of the equations (28) to (30) of motion, the partial differential equation (31) of energy conservation, may further have a function of setting the coefficient matrixes and constant vectors for equations containing such as electric-field and electric charge terms. In this case, the simulator is additionally provided with a unit for solving the following Maxwell's equations, to simulate the behavior of plasma:

$$\nabla \times E = -\frac{\partial B}{\partial t} \quad (32)$$

$$\nabla \times H = \frac{\partial D}{\partial t} + J \quad (33)$$

$$\nabla \cdot D = \rho_e \quad (34)$$

$$\nabla \cdot B = 0 \quad (35)$$

$$D = \epsilon_e E \quad (36)$$

$$B = \mu_m H \quad (37)$$

As explained above, the second embodiment of the present invention determines whether or not the generation process of reactants by the reaction between particles in a gas phase or plasma is in equilibrium, determines unknown variables without including variables related to reactants generated by an equilibrium reaction, and numerically solves equations that contain the unknown variables and express momentum conservation, energy conservation, and mass conservation. The second embodiment secures simulation accuracy. Even if the equations are complicated with geometrical parameters, the second embodiment secures the convergence of an iterative solution. The second embodiment omits useless and time consuming developments of calculation codes for different simulators. And the second embodiment can reduce manpower for the development and maintenance of the semiconductor manufacturing equipments such as oxidation furnaces, diffusion (predeposition) furnaces, VPE furnaces, CVD furnaces, plasma etching and plasma CVD equipment.

Various modifications will become possible for those skilled in the art after receiving the teachings of the present disclosure without departing from the scope thereof.

What is claimed is:

1. A method of determining a profile of particles in a semiconductor device, comprising the steps of:
   (a) storing reaction formulae describing reactions of the particles in a reaction table;
   (b) storing data indicating characteristics of the particles expressed with reaction formulae in a particle table;
   (c) automatically determining unknown variables excluding variables related to the reactants of each equilibrium reaction by judging whether or not each reaction formula generating reactants is in equilibrium;
   (d) automatically forming continuity equations containing a plurality of time differential terms as functions of the unknown variables;
   (e) automatically linearizing and discretizing the time differential terms into the coefficient matrix and constant vector of simultaneous linear equations; and
   (f) solving the simultaneous linear equations.

2. The method of claim 1, wherein the step (c) includes the steps of:
   automatically arranging the continuity equations in a sequence according to the reaction table and automatically preparing unknown indexes to indicate the sequence.

3. The method of claim 2, wherein the step (e) includes the step of:
   automatically incorporating time differential terms, space differential terms, and reaction terms of the continuity equations into the coefficient matrix and the constant vector of simultaneous linear equations by using the reaction table, the particle table, and the unknown indexes to generate the coefficient matrix and constant vector.

4. The method of claim 1, wherein the continuity equations are in the form of simultaneous partial differential equations comprising reaction rate equations that are functions of:
   the concentrations of the particles and the reactants related to the reaction formulae, and
   at least an equation that describes a drifting or a diffusing motion of at least one kind of the particles or the reactants in the semiconductor device.

5. The method of claim 4, wherein the simultaneous partial differential equations describe the diffusion of an impurity and point defects in the semiconductor device.

6. The method of claim 4, wherein the simultaneous partial differential equations assume that the reactions of an impurity-interstitial silicon pair and an impurity-vacancy pair in the semiconductor device, are each in equilibrium.

7. The method of claim 1, wherein the particle is at least one of an impurity, an interstitial silicon, a vacancy, an interstitial silicon trap, an impurity-interstitial silicon pair, an impurity vacancy pair, a combination of an interstitial silicon and an interstitial silicon trap, and an impurity cluster.

8. A semiconductor simulator for determining a profile of particles in a semiconductor device, comprising:
   (a) a reaction table storing reaction formulae describing reactions of the particles;
   (b) a particle table storing data indicating characteristics of the particles expressed with the reaction formulae;
   (c) means for automatically determining unknown variables excluding variables related to the reactants of each equilibrium reaction by judging whether or not each of the reaction formula generating the reactants is in equilibrium;
   (d) means for automatically forming continuity equations containing a plurality of time differential terms as functions of the unknown variables;
   (e) means for automatically linearizing and discretizing the time differential terms into a coefficient matrix and a constant vector of simultaneous linear equations; and
   (f) means for solving the simultaneous linear equations.

9. A method of determining a motion of particles in a gas phase in a semiconductor manufacturing equipment, comprising the steps of:
   (a) storing reaction formulae describing reactions of the particles in a reaction table;
   (b) storing data indicating characteristics of the particles expressed with reaction formulae in a particle table;
   (c) automatically determining unknown variables excluding variables related to the reactants of each equilibrium reaction by judging whether or not each of the reaction formula generating the reactants is in equilibrium;
   (d) automatically forming continuity equations containing a plurality of time differential terms as functions of the unknown variables;
   (e) automatically linearizing and discretizing the time differential terms into a coefficient matrix and a constant vector of simultaneous linear equations; and
   (f) solving the simultaneous linear equations.

10. The method of claim 9, wherein the step (c) includes the step of:
    automatically arranging the continuity equations in a sequence according to the reaction table and automatically preparing unknown indexes to indicate the sequence.

11. The method of claim 10, wherein the step (e) includes the step of:
    automatically incorporating time differential terms, space differential terms, and reaction terms of the continuity equations into the coefficient matrix and the constant vector of the simultaneous linear equations by using the reaction table, the particle table, and the unknown indexes to generate the coefficient matrix and the constant vector.

12. The method of claim 9, wherein the continuity equations are in the form of simultaneous partial differential equations comprising reaction rate equations that are functions of:
    the concentrations of the particles and the reactants related to the reactant formulae, and
    at least an equation that describes a drifting or a diffusing motion of at least one kind of the particles or the reactants in the gas phase.

13. A method of determining a geometry of a semiconductor device, comprising the steps of:
    (a) storing reaction formulae describing reactions of the particles in a reaction table;
    (b) storing data indicating characteristics of the particles expressed with reaction formulae in a particle table;

(c) automatically determining unknown variables excluding variables related to the reactants of each equilibrium reaction by judging whether or not each of the reaction formula generating reactants is in equilibrium;

(d) automatically forming continuity equations containing a plurality of time differential terms as functions of the unknown variables;

(e) automatically linearizing and discretizing the time differential terms into a coefficient matrix and constant vector of simultaneous linear equations; and (f) solving the simultaneous linear equations to generate motion vectors at nodes indicating the geometry of the semiconductor device.

14. The method of claim 13, wherein the step (f) includes the steps of:

adding the motion vectors to position vectors at the nodes;

judging whether or not boundaries constituting the geometry intersect each other, and judging whether or not meshes providing the nodes intersect each other.

15. The method of claim 13, wherein the step (c) includes the steps of:

automatically arranging the continuity equations in a sequence according to the reaction table and automatically preparing unknown indexes to indicate the sequence.

16. The method of claim 15, wherein the step(e) includes the step of:

automatically incorporating time differential terms, space differential terms, and reaction terms of the continuity equations into the coefficient matrix and constant vector of the simultaneous linear equations by using the reaction table, the particle table, and the unknown indexes to generate the coefficient matrix and the constant vector.

17. The method of claim 13, wherein the continuity equations are in the form of simultaneous partial differential equations comprising reaction rate equations that are functions of:

the concentrations of the particles and the reactants related to the reactant formulae, and at least an equation that describes a drifting or a diffusing motion of at least one kind of the particles or the reactants in the gas phase.

18. A simulator for determining a motion of particles in a gas phase in a semiconductor manufacturing equipment, comprising:

(a) a reaction table storing reaction formulae describing reactions of the particles;

(b) a particle table storing data indicating characteristics of the particles expressed with the reaction formulae;

(c) means for automatically determining unknown variables excluding variables related to the reactants of each equilibrium reaction by judging whether or not each of the reaction formula generating the reactants is in equilibrium;

(d) means for automatically forming continuity equations containing a plurality of time differential terms as functions of the unknown variables;

(e) means for automatically linearizing and discretizing the time differential terms into a coefficient matrix and a constant vector of simultaneous linear equations; and (f) means for solving the simultaneous linear equation s to generate motion vectors at nodes indicating the geometry of the semiconductor device.

19. A simulator for determining a geometry of a semiconductor device, comprising:

(a) a reaction table storing reaction formulae describing reactions of the particles;

(b) a particle table storing data indicating characteristics of the particles expressed with the reaction formulae;

(c) means for automatically determining unknown variables excluding variables related to the reactants of each equilibrium reaction by judging whether or not each of the reaction formula generating the reactants is in equilibrium;

(d) means for automatically forming continuity equations containing a plurality of time differential terms as functions of the unknown variables;

(e) means for automatically linearizing and discretizing the time differential terms into a coefficient matrix and a constant vector of simultaneous linear equations;

(f) means for solving the simultaneous linear equations to generate motion vectors at nodes indicating the geometry of these miconductor device; and (g) a geometry processor for obtaining the geometry using the motion vectors.

* * * * *